US012048106B2

(12) United States Patent
Do et al.

(10) Patent No.: US 12,048,106 B2
(45) Date of Patent: Jul. 23, 2024

(54) DISPLAY APPARATUS HAVING SIDE SURFACE DISPLAY PANEL

(71) Applicant: SAMSUNG ELECTRONICS CO., LTD., Suwon-si (KR)

(72) Inventors: Yonggu Do, Suwon-si (KR); Jisoo Kim, Suwon-si (KR); Jaehoo Park, Suwon-si (KR); Minhee Lee, Suwon-si (KR); Sangkyun Im, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 268 days.

(21) Appl. No.: 17/745,201

(22) Filed: May 16, 2022

(65) Prior Publication Data

US 2023/0027297 A1   Jan. 26, 2023

Related U.S. Application Data

(63) Continuation of application No. PCT/KR2021/016122, filed on Nov. 8, 2021.

(30) Foreign Application Priority Data

Jul. 22, 2021   (KR) .................. 10-2021-0096193

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC .... H05K 5/0017; H05K 5/0217; G09F 9/302; G09F 9/33; G03B 21/10; G02F 1/3336;
(Continued)

(56) References Cited

U.S. PATENT DOCUMENTS 6,324,000 B1 * 11/2001 Soulis .................... G03B 21/10
359/449
7,864,514 B2    1/2011 Lee et al.
(Continued)

FOREIGN PATENT DOCUMENTS

JP    2002-165157    6/2002
KR   20-0231950 Y1    7/2001
(Continued)

OTHER PUBLICATIONS

International Search Report dated Apr. 13, 2022 in PCT Application No. PCT/KR2021/016122.
(Continued)

*Primary Examiner* — Tuan T Dinh
(74) *Attorney, Agent, or Firm* — STAAS & HALSEY LLP

(57) ABSTRACT

A display apparatus including a front surface display panel including a side part that has a first mounting surface that is tilted, and at least one terminal arranged in the first mounting surface; a side surface display panel having a second mounting surface that is tilted so as to correspond to the first mounting surface, and the side surface display panel including at least one terminal arranged in the second mounting surface, wherein the side surface display panel is connected to the side part of the front surface display panel with the first mounting surface and the second mounting surface facing each other, and the at least one terminal arranged in the first mounting surface is electronically connected to the at least one terminal arranged in the second mounting surface, respectively, to electronically connect the front surface display panel and the side surface display panel.

15 Claims, 22 Drawing Sheets

(58) Field of Classification Search
CPC ... G06F 1/16; G06F 1/18; G06F 1/182; G06F 1/601; G06F 1/658; G06F 1/679; H04B 1/3888
USPC ......... 361/749–750, 679.02, 679.12, 679.21, 361/679.4, 679.55–57, 803, 814; 174/250–258; 349/149–151; 359/443, 359/447

See application file for complete search history.

(56) References Cited

U.S. PATENT DOCUMENTS

| | | | |
|---|---|---|---|
| 8,208,248 | B2 | 6/2012 | Koenig |
| 8,456,104 | B2 | 6/2013 | Allard et al. |
| 8,472,114 | B2* | 6/2013 | Watanabe ............ G02F 1/13336 359/449 |
| 8,934,059 | B2 | 1/2015 | Lowe et al. |
| 9,997,130 | B2 | 6/2018 | Lee et al. |
| 10,115,372 | B2 | 10/2018 | Whang et al. |
| 10,222,650 | B2 | 3/2019 | Kim et al. |
| 10,310,313 | B2 | 6/2019 | Lee et al. |
| 10,429,883 | B2 | 10/2019 | Azam et al. |
| 10,551,656 | B2 | 2/2020 | Kim et al. |
| 10,854,147 | B2 | 12/2020 | Sydorenko et al. |
| 11,054,861 | B2* | 7/2021 | Bushnell ................ H10K 50/84 |
| 2009/0091881 | A1 | 4/2009 | Lee |
| 2011/0018849 | A1 | 1/2011 | Lowe et al. |
| 2013/0009852 | A1 | 1/2013 | Moscovitch |
| 2013/0271447 | A1 | 10/2013 | Setler et al. |
| 2014/0055014 | A1* | 2/2014 | Pan ...................... H04B 1/3888 312/223.2 |
| 2016/0156755 | A1* | 6/2016 | Choi ..................... G06F 1/1658 455/575.1 |
| 2016/0284497 | A1* | 9/2016 | Stryker ................ G06F 1/1679 |
| 2017/0053478 | A1 | 2/2017 | Wudtke et al. |
| 2017/0208287 | A1 | 7/2017 | Lim et al. |
| 2018/0052497 | A1* | 2/2018 | Määttä ...................... E05D 3/12 |
| 2018/0239084 | A1 | 8/2018 | Kim et al. |
| 2019/0293861 | A1* | 9/2019 | Hyun ................... G02B 6/0068 |

FOREIGN PATENT DOCUMENTS

| | | |
|---|---|---|
| KR | 10-2006-0077631 A | 7/2006 |
| KR | 10-0596225 | 7/2006 |
| KR | 10-2009-0036190 | 4/2009 |
| KR | 10-2014-0017777 A | 2/2014 |
| KR | 10-1472508 B1 | 12/2014 |
| KR | 10-2016-0027801 A | 3/2016 |
| KR | 10-2016-0144253 A | 12/2016 |
| KR | 10-1728492 B1 | 5/2017 |
| KR | 10-1796709 B1 | 11/2017 |
| KR | 10-2018-0003353 A | 1/2018 |
| KR | 10-2018-0063591 A | 6/2018 |
| KR | 10-2018-0071657 A | 6/2018 |
| KR | 10-1974457 B1 | 5/2019 |
| KR | 10-2019-0067189 A | 6/2019 |
| KR | 10-2019-0104852 A | 9/2019 |
| KR | 10-2046491 B1 | 11/2019 |
| KR | 10-2051958 B1 | 11/2019 |
| KR | 10-2102154 B1 | 5/2020 |
| KR | 10-2020-0070507 A | 6/2020 |
| KR | 10-2020-0116262 A | 10/2020 |
| KR | 20-2020-0002233 U | 10/2020 |
| KR | 10-2180820 B1 | 11/2020 |
| KR | 10-2195217 B1 | 12/2020 |
| KR | 10-2205217 B1 | 1/2021 |

OTHER PUBLICATIONS

Written Opinion of the International Searching Authority dated Apr. 13, 2022 in PCT Application PCT/KR2021/016122.

* cited by examiner

DISPLAY APPARATUS HAVING SIDE SURFACE DISPLAY PANEL

CROSS-REFERENCE TO RELATED APPLICATIONS

This application is a bypass continuation of International Application No. PCT/KR2021/016122, filed on Nov. 8, 2021, which is based on and claims priority to Korean Patent Application No. 10-2021-0096193, filed on Jul. 22, 2021, in the Korean Intellectual Property Office, the disclosures of which are incorporated by reference herein in their entireties.

BACKGROUND

1. Field

The disclosure relates to a display apparatus, for example, a display apparatus including a side surface display panel arranged in a side part of a front surface display panel.

2. Description of the Related Art

Spurred by the development of electronic technologies, display apparatuses are being developed rapidly in recent few years. As a screen of a display apparatus became bigger, and a resolution was improved, various methods for utilization are being searched other than a use for simply reproducing contents, and a need for providing various functions such as providing an aesthetic function by using a display apparatus has risen.

SUMMARY

According to an embodiment of the disclosure, a display apparatus may include a front surface display panel including a side part that has a first mounting surface that is tilted, and at least one terminal arranged in the first mounting surface; and a side surface display panel having a second mounting surface that is tilted so as to correspond to the first mounting surface, and the side surface display panel including at least one terminal arranged in the second mounting surface, wherein the side surface display panel is connected to the side part of the front surface display panel with the first mounting surface and the second mounting surface facing each other, and the at least one terminal arranged in the first mounting surface is electronically connected to the at least one terminal arranged in the second mounting surface, respectively, to electronically connect the front surface display panel and the side surface display panel.

According to an embodiment of the disclosure, the side surface display panel may have a screen part, the front surface display panel may have a screen part, and the screen part of the side surface display panel may extend toward a rear of the display apparatus at a right angle from the screen part of the front surface display panel.

According to an embodiment of the disclosure, the side surface display panel may have a screen part, the front surface display panel may have a screen part, and the screen part of the side surface display panel may extend toward a rear of the display apparatus at an acute angle from the screen part of the front surface display panel.

According to an embodiment of the disclosure, the side surface display panel may have a screen part, the front surface display panel may have a screen part, and the screen part of the side surface display panel may extend toward a front of the display apparatus at an obtuse angle from the screen part of the front surface display panel. Also, according to an embodiment of the disclosure, the screen part of the side surface display panel may sequentially continue with the screen part of the front surface display panel.

According to an embodiment of the disclosure, the side surface display panel may be configured to receive a control signal from, and be supplied with power from, the front surface display panel through the at least one terminal arranged in the first mounting surface and the at least one terminal arranged in the second mounting surface.

According to an embodiment of the disclosure, the at least one terminal arranged in the first mounting surface may include a first terminal and a second terminal, and the at least one terminal arranged in the second mounting surface may include a third terminal that is connected to the first terminal to receive a control signal from the front surface display panel, and a fourth terminal connected to the second terminal to be supplied with power from the front surface display panel. According to an embodiment, one terminal of the first terminal and the third terminal may elastically contact the other terminal of the first terminal and the third terminal, and one terminal of the second terminal and the fourth terminal may elastically contact the other terminal of the first terminal and the third terminal.

According to an embodiment of the disclosure, a plurality of first magnets may be coupled to one mounting surface of the first mounting surface and the second mounting surface, and a plurality of second permanent magnets respectively corresponding to the plurality of first permanent magnets may be coupled to the other mounting surface of the first mounting surface and the second mounting surface.

According to an embodiment of the disclosure, a plurality of coupling projections may be provided on one mounting surface of the first mounting surface and the second mounting surface, and a plurality of coupling holes may be provided on the other mounting surface of the first mounting surface and the second mounting surface, and the plurality of coupling projections may be snap-coupled to the plurality of coupling holes.

According to an embodiment of the disclosure, the side surface display panel may be pivotable in a clockwise direction or in a counter-clockwise direction centered around a boundary with the front surface display panel.

According to an embodiment of the disclosure, the display apparatus may further include a guide rod that pivotably connects the side surface display panel to the front surface display panel, and the guide rod may have a curvature corresponding to a pivoting radius of the side surface display panel.

According to an embodiment of the disclosure, electronic connection of the side surface display panel with the front surface display panel may be maintained within a pivotable range of the side surface display panel.

According to an embodiment of the disclosure, the at least one terminal arranged in the first mounting surface may include a first terminal and a second terminal, the at least one terminal arranged in the second mounting surface may include a third terminal connected to the first terminal to receive a control signal from the front surface display panel, and a fourth terminal connected to the second terminal to be supplied with power from the front surface display panel, one terminal of the first terminal and the third terminal may elastically contact the other terminal of the first terminal and the third terminal, and one terminal of the second terminal and the fourth terminal may elastically contact the other terminal of the first terminal and the third terminal Also, according to an embodiment of the disclosure, the side surface display panel may including a screen part having a curved surface.

Also, according to another embodiment of the disclosure, a display apparatus may include a front surface display panel, and first to fourth side surface display panels that are detachably connected to first to fourth mounting surfaces respectively provided on an upper side, a lower side, a left side, and a right side of the front surface display panel, wherein the respective first to fourth side surface display panels include terminals that are detachably connected with terminals included in the front surface display panel may be provided.

According to an embodiment of the disclosure, screen parts of the first to fourth side surface display panels may respectively be arranged to be tilted toward a rear part of the front surface display panel or arranged to be tilted toward a front part of the front surface display panel based on a screen part of the front surface display panel.

According to an embodiment of the disclosure, electronic connection between the terminals of the first to fourth side surface display panels and the terminals of the front surface display panel may be maintained by an elastic force.

According to an embodiment of the disclosure, the first to fourth side surface display panels may respectively be connected detachably with the front surface display panel through a magnetic force by a plurality of permanent magnets. Also, according to an embodiment of the disclosure, the first to fourth side surface display panels may respectively be connected pivotably with the front surface display panel, and the first to fourth side surface display panels may respectively pivot centered around a boundary with the front surface display panel.

DESCRIPTION OF THE DRAWINGS

Additional aspects will be set forth in part in the description which follows and, in part, will be apparent from the description, or may be learned by practice of the presented embodiments.

DETAILED DESCRIPTION

Figure 1:
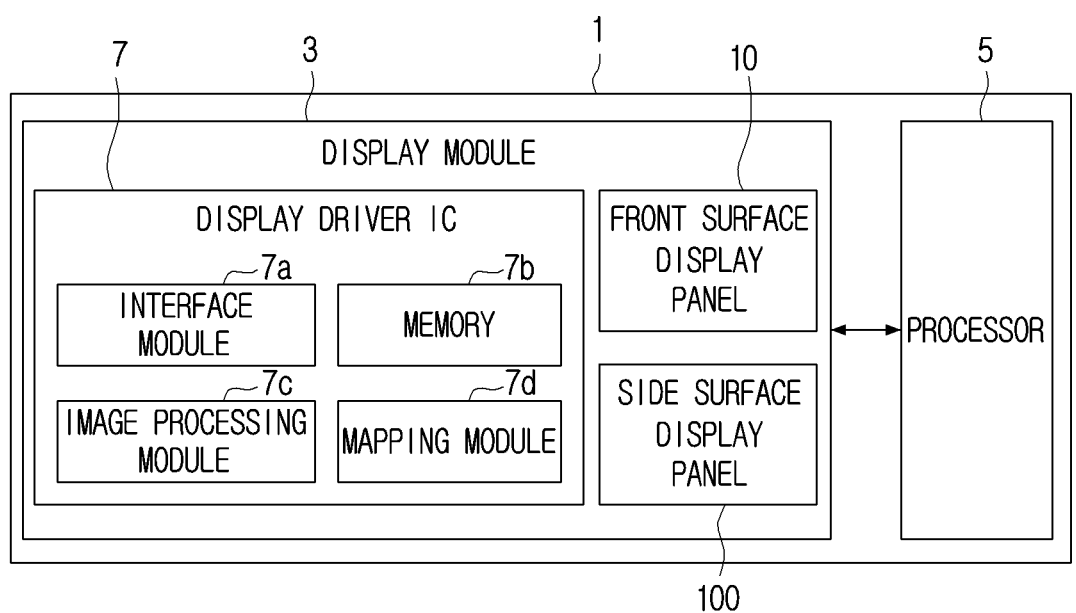
FIG. 1 is a block diagram illustrating a display appliance according to various embodiments of the disclosure.

First, terms used in the disclosure will be described briefly, and then the disclosure will be described in detail. Meanwhile, in describing the disclosure, detailed explanation regarding related known technologies may be omitted, and overlapping explanation of the same components will be omitted as much as possible.

As terms used in the embodiments of the disclosure, general terms that are currently used widely were selected as far as possible, in consideration of the functions described in the disclosure. However, the terms may vary depending on the intention of those skilled in the art who work in the pertinent technical field or previous court decisions, emergence of new technologies, etc. Also, in particular cases, there may be terms that were arbitrarily designated by the applicant, and in such cases, the meaning of the terms will be described in detail in the relevant descriptions in the disclosure. Accordingly, the terms used in the disclosure should be defined based on the meaning of the terms and the overall content of the disclosure, but not just based on the names of the terms.

Also, various modifications may be made to the embodiments of the disclosure, and there may be various types of embodiments. Accordingly, specific embodiments will be illustrated in drawings, and the embodiments will be described in detail in the detailed description. However, it should be noted that the various embodiments are not for limiting the scope of the disclosure to a specific embodiment, but they should be interpreted to include all modifications, equivalents, or alternatives included in the ideas and the technical scopes disclosed herein. Further, in case it is determined that in describing embodiments, detailed explanation of related known technologies may unnecessarily confuse the gist of the disclosure, the detailed explanation will be omitted.

Meanwhile, terms such as "first," "second," and "third" may be used to describe various components, but these components are not to be limited by the aforementioned terms. The aforementioned terms may be used only for the purpose of distinguishing one component from another component. For example, a first component may be called a second component, and a second component may be called a first component in a similar manner, without departing from the scope of the disclosure.

Also, singular expressions include plural expressions, as long as they do not obviously mean differently in the context. Further, in the disclosure, terms such as "include" and "consist of" should be construed as designating that there are such characteristics, numbers, steps, operations, elements, components, or a combination thereof described in the specification, but not as excluding in advance the existence or possibility of adding one or more of other characteristics, numbers, steps, operations, elements, components, or a combination thereof.

In addition, in the disclosure, "a module" or "a part" performs at least one function or operation, and may be implemented as hardware or software, or as a combination of hardware and software. Also, a plurality of "modules" or "parts" may be integrated into at least one module and implemented as at least one processor, except "modules" or "parts" which need to be implemented as specific hardware.

A display module may include a display panel. A display panel is a kind of flat display panel, and in the panel, a plurality of inorganic light emitting diodes (LEDs) of which sizes are smaller than or equal to 100 micrometers respectively may be arranged. Compared to a liquid crystal display (LCD) panel which needs a backlight, a micro LED display module provides better contrast, response time, and energy efficiency. Both of organic LEDs and micro LEDs which are inorganic LEDs have good energy efficiency, but micro LEDs have better brightness and light emitting efficiency, and a longer lifespan. Micro LEDs may be semiconductor chips that can emit a light by themselves in case power is supplied. Micro LEDs have faster response speed, low power consumption, and high luminance. Specifically, micro LEDs have higher efficiency in converting electricity into photons than a conventional liquid crystal display (LCD) or organic light emitting diodes (OLEDs). That is, micro LEDs have higher "brightness per watt" than a conventional LCD or OLED display. Accordingly, micro LEDs can exert identical brightness with about half the energy compared to conventional LEDs (of which length, width, and height respectively exceed 100 μm) or OLEDs. Other than this, micro LEDs can implement high resolution, excellent colors, contrast, and brightness, and thus they can express colors in a wide range correctly, and can implement a clear screen outdoors. Also, micro LEDs are strong against a burn-in phenomenon and generate little heat, and thus a long lifespan without distortion is guaranteed.

Micro LEDs may have a flip chip structure wherein an anode electrode terminal and a cathode electrode terminal are formed on the same first surface, and a light emitting surface is formed on a second surface positioned on the opposite side of the first surface wherein the electrode terminals are formed.

On a glass substrate, a TFT layer wherein a thin film transistor (TFT) circuit is formed may be arranged in the front surface, and a driving circuit for driving the TFT circuit may be arranged on the rear surface. The TFT circuit may drive a plurality of pixels arranged in the TFT layer.

The front surface of the glass substrate may be divided into an active area and an inactive area. The active area may correspond to an area occupied by the TFT layer in the front surface of the glass substrate, and the inactive area may be an area excluding the area occupied by the TFT layer in the front surface of the glass substrate.

The edge area of the glass substrate may be the outermost part of the glass substrate. Also, the edge area of the glass substrate may be the remaining area of the glass substrate excluding the area wherein the circuit is formed. Further, the edge area of the glass substrate may include a side surface of the glass substrate, and a part of the front surface of the glass substrate and a part of the rear surface of the glass substrate adjacent to this side surface. The glass substrate may be formed as a quadrangle type. Specifically, the glass substrate may be formed as a rectangle or a square. The edge area of the glass substrate may include at least one side among the four sides of the glass substrate.

The display module includes the glass substrate wherein a plurality of LEDs are mounted and a side surface wiring is formed. Such a display module may be installed and applied as a single unit on a wearable device, a portable device, a handheld device, and an electronic product or an electronic element that needs various kinds of displays. Also, the display module may be applied to a display apparatus such as a monitor for a personal computer (PC), a high resolution TV and signage (or, digital signage), an electronic display, etc. through a plurality of assembly arrangements as a matrix type.

Hereinafter, the embodiments of the disclosure will be described in detail with reference to the accompanying drawings, such that those having ordinary skill in the art to which the disclosure belongs can easily carry out the disclosure. However, it should be noted that the disclosure may be implemented in various different forms, and is not limited to the embodiments described herein. Also, in the drawings, parts that are not related to explanation were omitted, for explaining the disclosure clearly, and throughout the specification, similar components were designated by similar reference numerals.

Further, while the embodiments of the disclosure will be described in detail with reference to the following accompanying drawings and the content described in the accompanying drawings, it is not intended that the disclosure is restricted or limited by the embodiments.

According to various embodiments of the disclosure, a display apparatus which is capable of providing various kinds of additional information to a user through a side surface screen or providing a sense of immersion by creating a stereoscopic display effect by arranging a side surface display panel in a side part of a front surface display panel may be provided.

Hereinafter, a display apparatus according to the various embodiments of the disclosure will be described.

FIG. 1 is a block diagram illustrating a display appliance according to various embodiments of the disclosure.

Referring to FIG. 1, a display apparatus 1 according to an embodiment of the disclosure may include a display module 3 and a processor 5.

The display module 3 according to an embodiment of the disclosure may display various images. Here, an image is a concept including a still image and/or a moving image. The display module 3 may display various images such as a broadcast content, a multimedia content, etc. Also, the display module 3 may display a user interface (UI) and icons.

The display nodule 3 may include a front surface display panel 10 and a display driver IC (DDI) 7 for controlling it.

The display driver IC 7 may include an interface module 7*a*, a memory 7*b* (e.g.: a buffer memory), an image processing module 7*c*, or a mapping module 7*d*. The display driver IC 7 may receive, for example, image data, or image information including an image control signal corresponding to a command for controlling the image data from another component of the display apparatus 1 through the interface module 7*a*. For example, according to an embodiment of the disclosure, image information may be received from a processor 5 (e.g.: a main processor (e.g.: an application processor) or a subsidiary processor (e.g.: a graphic processing apparatus) that is independently operated from the function of the main processor).

The display driver IC 7 may communicate with a sensor module (not shown) through the interface module 7*a*. Also, the display driver IC 7 may store at least some of the received image information in the memory 7*b* as, for example, a frame unit. The image processing module 7*c* may perform, for example, pre-processing or post-processing (e.g., adjustment of a resolution, brightness, or a size) on at least some of the image data at least partially based on the characteristic of the image data or the characteristic of the front surface display panel 10. The mapping module 7*d* may generate a voltage value or a current value corresponding to the pre-processed or post-processed image data through the image processing module 7*c*. According to an embodiment of the disclosure, generation of a voltage value or a current value may be performed, for example, at least partially based on the attributes of the pixels of the front surface display panel 10 (e.g.: the arrangement of the pixels (an RGB stripe or a pentile structure), or the sizes of the respective sub-pixels). At least some pixels of the front surface display panel 10 may be driven, for example, at least partially based on the voltage value or the current value, and accordingly, visual information (e.g.: texts, images, or icons) corresponding to the image data may be displayed through the display panel 10.

The display driver IC 7 may transmit a driving signal (e.g.: a driver driving signal, a gate driving signal, etc.) to the display based on image information received from the processor 5.

The display driver IC 7 may display an image based on an image signal received from the processor 5. As an example, the display driver IC 7 may generate a driving signal of a plurality of sub-pixels based on an image signal received from the processor 5, and control light emission of the plurality of sub pixels based on the driving signal, and thereby display an image.

The display module 3 may further include a touch circuit (not shown). The touch circuit may include a touch sensor and a touch sensor IC for controlling it. The touch sensor IC may, for example, control the touch sensor for detecting a touch input or a hovering input for a designated location of the front surface display panel 10. For example, the touch sensor IC may detect a touch input or a hovering input by measuring a change of a signal for a designated location of the front surface display panel 10 (e.g.: the voltage, the light amount, the resistance, or the charge amount). The touch sensor IC may provide information for the detected touch input or hovering input (e.g.: the location, the area, the pressure, or the time) to the processor 13. According to an embodiment of the disclosure, at least a part of the touch circuit (e.g.: the touch sensor IC) may be included as a part of the display driver IC 7, or the front surface display panel 10, or as a part of another component (e.g.: a subsidiary processor) arranged outside the display module 3.

The processor 5 may be implemented as a digital signal processor (DSP) processing digital image signals, a microprocessor, a graphics processing unit (GPU), an artificial intelligence (AI) processor, a neural processing unit (NPU), and a time controller (TCON). However, the disclosure is not limited thereto, and the processor 5 may include one or more of a central processing unit (CPU), a micro controller unit (MCU), a micro processing unit (MPU), a controller, an application processor (AP), or a communication processor (CP), and an ARM processor, or may be defined by the terms. Also, the processor 5 may be implemented as a system on chip (SoC) having a processing algorithm stored therein or large scale integration (LSI), or in the form of an application specific integrated circuit (ASI), or a field programmable gate array (FPGA).

The processor 5 may drive an operation system or an application program and thereby control hardware or software components connected to the processor 5, and perform various kinds of data processing and operations. Also, the processor 5 may load commands or data received from at least one of other components on a volatile memory and process them, and store various data in the volatile memory.

The display module 3 may include at least two side surface display panels 100. In this case, the side surface display panels 100 may be controlled by the aforementioned display driver IC 7. Alternatively, the side surface display panels 100 may be controlled by a separate display driver IC (not shown).

The side surface display panels 100 may be arranged in side parts of the front surface display panel 10 and extend the screen of the front surface display panel 100, or display additional information (e.g.: the weather, the time, the sound volume, information on an image that is being displayed, channel information, etc.).

Hereinafter, various embodiments of the side surface display panels 100 that are electronically and physically connected to the front surface display panel 10 will be described with reference to the drawings.

Figure 2:
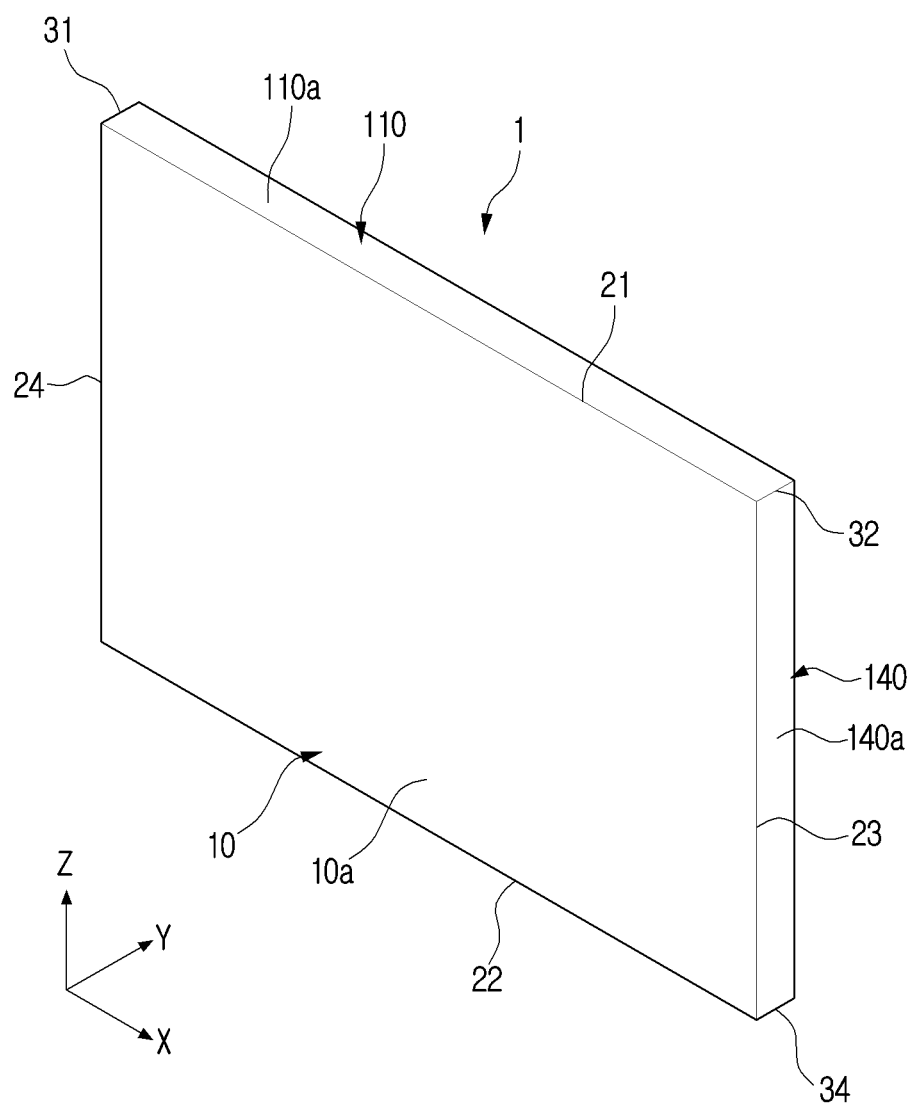
FIG. 2 and FIG. 3 are perspective views viewing a display apparatus according to an embodiment of the disclosure in different directions respectively.
Figure 3:
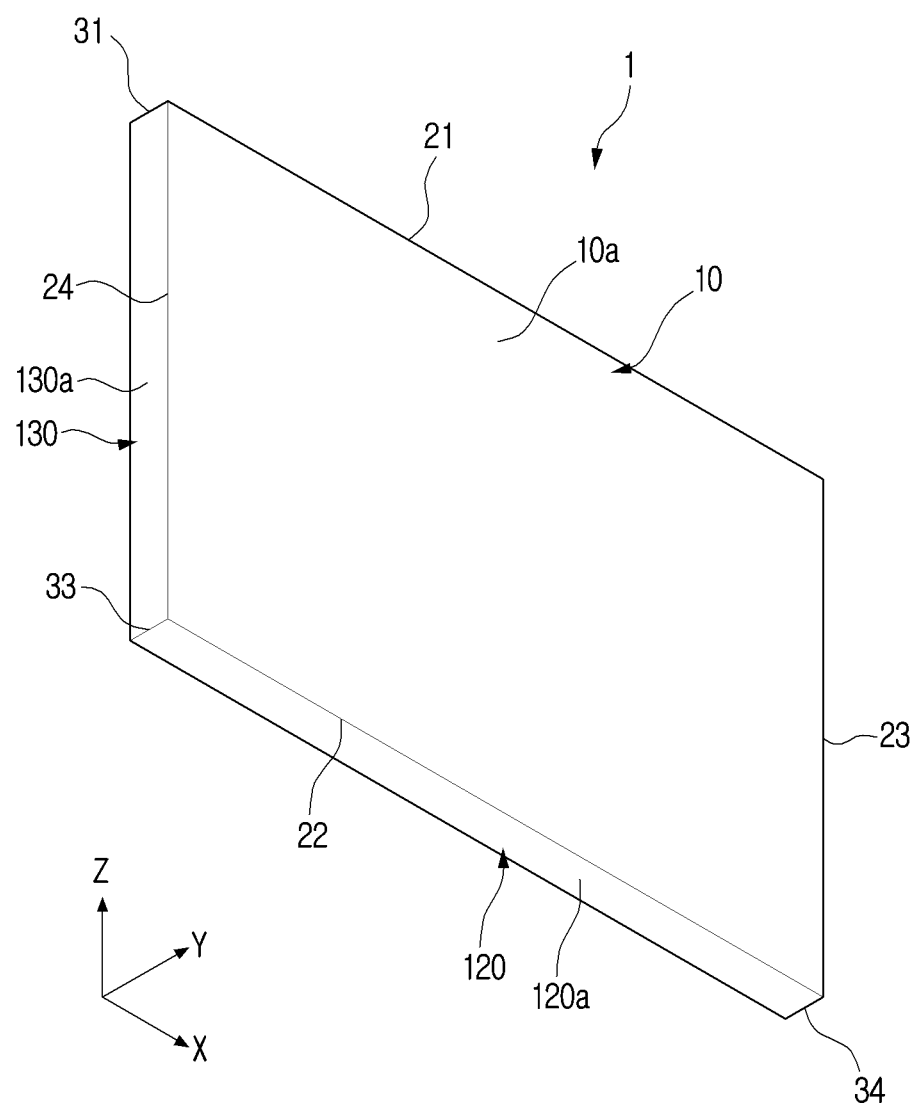

FIG. 2 and FIG. 3 are perspective views viewing a display apparatus according to an embodiment of the disclosure in different directions respectively.

Referring to FIG. 2 and FIG. 3, in the display apparatus 1 according to an embodiment of the disclosure, the first to fourth side surface display panels 110, 120, 130, 140 may be arranged in each side part (the upper side, the lower side, the left side, the right side) of the front surface display panel 10.

However, the disclosure is not limited thereto, and the side surface display panels may be arranged only in at least two side parts of the front surface display panel 10. For example, the first and second side surface display panels 110, 120 may be arranged only on the upper side and the lower side of the front surface display panel 10, or the third and fourth side surface display panels 130, 140 may be arranged only on the left side and the right side of the front surface display panel 10.

The screen parts 110*a*, 120*a*, 130*a*, 140*a* of the first to fourth side surface display panels 110, 120, 130, 140 may respectively be arranged at a right angle (or an angle that is almost close to a right angle) based on the screen part 10*a* of the front surface display panel 10. In this case, the boundaries 21, 22, 23, 24 that are respectively contacted by the first to fourth side surface display panels 110, 120, 130, 140 and the front surface display panel 10 may be adhered to one another without a gap. Accordingly, the screen part of the front surface display panel 10 wherein images are displayed may be sequentially continued with the respective screen parts of the first to fourth side surface display panels 110, 120, 130, 140. For example, the front surface display panel 10 and the first to fourth side surface display panels 110, 120, 130, 140 may be used as one display area.

Also, the boundaries 31, 32, 33, 34 among the respective side surface display panels 110, 120, 130, 140 adjacent to one another may also be adhered without a gap. The respective screen parts among the first to fourth side surface display panels 110, 120, 130, 140 adjacent to one another may be sequentially continued.

Through this, an image displayed in the screen part of the front surface display panel 10 may be displayed while being extended naturally in the respective screen parts of the first to fourth side surface display panels 110, 120, 130, 140 without breakage.

As described above, for displaying an image without breakage through the front surface display panel 10 and the first to fourth side surface display panels 110, 120, 130, 140, the front surface display panel 10 and the first to fourth side surface display panels 110, 120, 130, 140 may be bezel-less display panels.

The first to fourth side surface display panels 110, 120, 130, 140 may be controlled by the processor 5 such that all of them are turned on while the front surface display panel 10 is turned on.

Alternatively, the first to fourth side surface display panels 110, 120, 130, 140 may be controlled by the processor 5 such that, while the front surface display panel 10 is turned on, two side surface display panels facing each other among the first to fourth side surface display panels 110, 120, 130, 140 are turned on, and the other two side surface display panels facing each other are turned off.

Alternatively, the first to fourth side surface display panels 110, 120, 130, 140 may be controlled by the processor 5 such that, while the front surface display panel 10 is turned off, at least one of the first to fourth side surface display panels 110, 120, 130, 140 is turned on.

Hereinafter, an electronic and physical connection structure between the front display panel 10 and the first side surface display panel 110 will be described with reference to the drawings.

Figure 4:
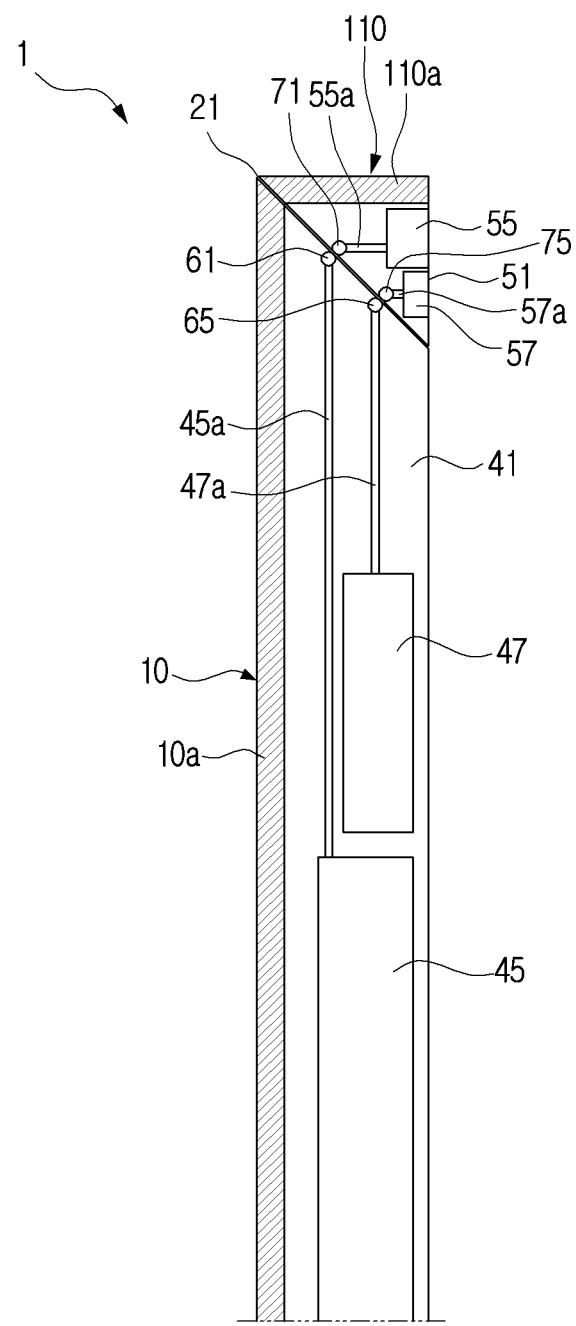
FIG. 4 is a schematic cross-sectional view illustrating a configuration wherein a front surface display panel and a side surface display panel of a display apparatus according to an embodiment of the disclosure are electronically connected with each other.
Figure 5:
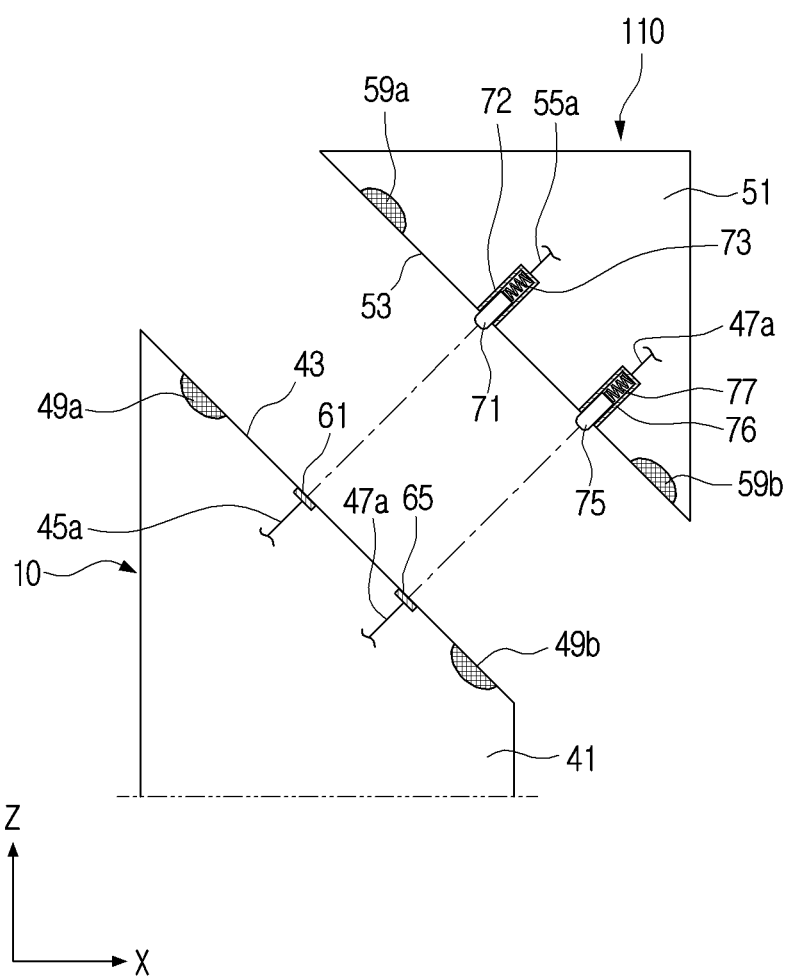
FIG. 5 is a diagram illustrating a state wherein a front surface display panel and a side surface display panel of a display apparatus according to an embodiment of the disclosure are separated.
Figure 6:
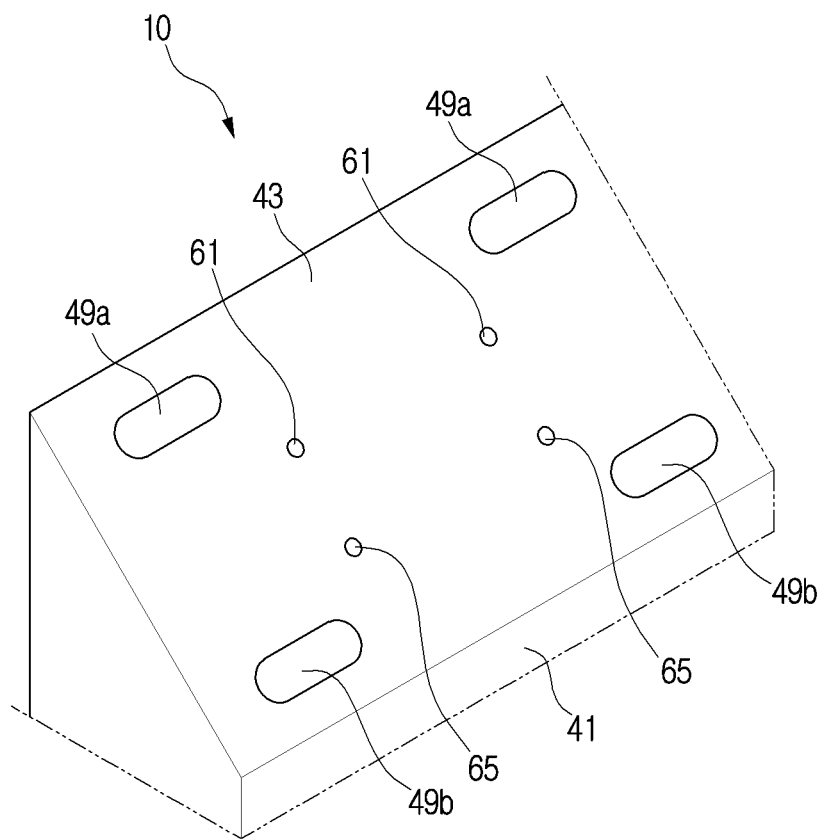
FIG. 6 is a diagram illustrating a part of a front surface display panel of a display apparatus according to an embodiment of the disclosure.
Figure 7:
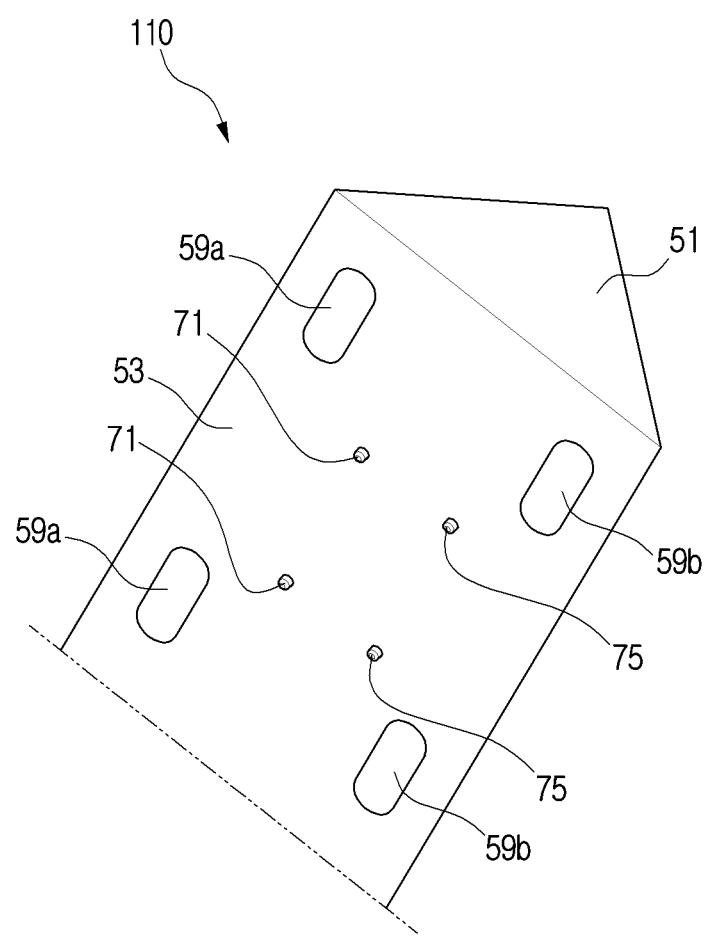
FIG. 7 is a diagram illustrating a part of a side surface display panel of a display apparatus according to an embodiment of the disclosure.

FIG. 4 is a schematic cross-sectional view illustrating a configuration wherein a front surface display panel and a side surface display panel of a display apparatus according to an embodiment of the disclosure are electronically connected with each other, FIG. 5 is a diagram illustrating a state wherein a front surface display panel and a side surface display panel of a display apparatus according to an embodiment of the disclosure are separated, FIG. 6 is a diagram illustrating a part of a front surface display panel of a display apparatus according to an embodiment of the disclosure, and FIG. 7 is a diagram illustrating a part of a side surface display panel of a display apparatus according to an embodiment of the disclosure.

Referring to FIG. 4, the front surface display panel 10 may include a housing 41 and a front surface screen part 10a supported by the housing 41. The front surface screen part 10a may display an image toward the front part of the display apparatus 1. On the inner side of the housing 41, a first control module 45 for controlling the screen part 10a, and a first power supply module 47 for supplying power to the front surface display panel 10 may be arranged.

The first control module 45 may include the processor 5 and the display driver IC 7 described above.

The first side surface display panel 110 may include a housing 51 and an upper surface screen part 110a supported by the housing 51. The upper surface screen part 110a may display an image toward the upper part of the display apparatus 1. On the inner side of the housing 51, a second control module 55 for controlling the screen part 110a, and a second power supply module 57 for supplying power to the first side surface display panel 110 may be arranged.

The second control module 55 may be electronically connected with the first control module 45 such that it can be controlled by the processor 5. For example, the first control module 45 includes a first terminal 61 connected with a wiring 45a, and the second control module 55 includes a second terminal 71 connected with a wiring 55a. In this case, the first terminal 61 and the second terminal 71 are arranged in locations facing each other in case the front surface display panel 10 and the first side surface display panel 110 are physically coupled, and accordingly, electronic connection may be formed.

The second power supply module 57 may be electronically connected with the first power supply module 47 such that it can be supplied with power from the first power supply module 47. For example, the first power supply module 47 includes a third terminal 65 connected with a wiring 47a, and the second power supply module 57 includes a fourth terminal 75 connected with a wiring 57a. In this case, the third terminal 65 and the fourth terminal 75 are arranged in locations facing each other in case the front surface display panel 10 and the first side surface display panel 110 are physically coupled, and accordingly, electronic connection may be formed.

Referring to FIG. 5, in the housing 41 of the front surface display panel 10, a tilted first mounting surface 43 may be provided in the upper part. The first mounting surface 43 may be tilted toward a lower direction from the front part to the rear part.

In the first mounting surface 43, a plurality of first permanent magnets 49a, 49b, and a first terminal 61 and a third terminal 65 may be arranged.

Referring to FIG. 6, the plurality of first permanent magnets 49a, 49b may be buried at intervals along a front part edge and a rear part edge of the first mounting surface 43. The plurality of first permanent magnets 49a, 49b are components for physically coupling the front surface display panel 10 and the first side surface display panel 110 to be detachable.

The first terminal 61 may be buried in the housing 41 such that a part is exposed to be connectable with the second terminal 71 and the remaining part is not projected more than the first mounting surface 43. The third terminal 65 may also be buried in the housing 41 such that a part is exposed to be connectable with the fourth terminal 75 and the remaining part is not projected more than the first mounting surface 43.

In the housing 51 of the first side surface display panel 110, a second mounting surface 53 wherein the first mounting surface 43 is seated in the lower part may be provided. The second mounting surface 53 may be titled toward a lower direction from the front part to the rear part.

The tilted angles of the first mounting surface 43 and the second mounting surface 53 may be angles wherein the front surface screen part 10a and the upper surface screen part 110a may maintain right angles or angles almost close to a right angle in case the front surface display panel 10 and the first side surface display panel 110 are connected.

Referring to FIG. 7, in the second mounting surface 53, a plurality of second permanent magnets 59a, 59b, and a second terminal 71 and a fourth terminal 75 may be arranged.

The plurality of second permanent magnets 59a, 59b may be buried at intervals along a front part edge and a rear part edge of the second mounting surface 53. In this case, the plurality of second permanent magnets 59a, 59b may be arranged in specific locations in the second mounting surface 53 so as to respectively correspond to the plurality of first permanent magnets 49a, 49b in case the front surface display panel 10 and the first side surface display panel 110 are connected.

Accordingly, the first permanent magnets 49a, 49b and the second permanent magnets 59a, 59b may physically connect the front surface display panel 10 and the first side surface display panel 110 to be detachable from each other.

In the disclosure, physical connection between the front surface display panel 10 and the first side surface display panel 110 is implemented by using a magnetic force as described above, but the disclosure is not limited thereto. For example, a snap fit structure may be provided between the front surface display panel 10 and the first side surface display panel 110, and the front surface display panel 10 and the first side surface display panel 110 may be connected to be detachable from each other. For example, the snap fit structure may include a plurality of coupling projections (not shown) formed on one mounting surface between the first mounting surface 43 and the second mounting surface 53, and a plurality of coupling holes to which the plurality of coupling projections are snap-coupled on the other mounting surface.

Referring to FIG. 5, the second terminal 71 may be elastically arranged to be projected more than the second mounting surface 53. For example, a part of the second terminal 71 may be inserted into the guide member 72 buried in the housing 51 to be slidable, and the second terminal 71 may be elastically supported by the elastic member 73 arranged on the inner side of the guide member 72. In case the front surface display panel 10 and the first side surface display panel 110 are connected, the second terminal 71 may be connected with the first terminal 61 and elastically inserted into the inner side of the guide member 72. Accordingly, the first terminal 61 and the second terminal 71 may constitute a connection that is electronically stable.

The fourth terminal 75 is also elastically supported by the elastic member 77 like the aforementioned second terminal 71, and is slidably arranged along the guide member 76. In case the front surface display panel 10 and the first side surface display panel 110 are connected, the fourth terminal 75 may be connected with the third terminal 65 and elastically inserted into the inner side of the guide member 76. Accordingly, the third terminal 65 and the fourth terminal 75 may constitute a connection that is electronically stable.

Meanwhile, in the disclosure, it was described that the first and third terminals 61, 65 are installed on the front surface display panel 10, and the second and fourth terminals 71, 75 are arranged on the fourth side surface display panel 140, but on the contrary, it is also possible to install the first and third terminals 61, 65 on the fourth side surface display panel 140, and arrange the second and fourth terminals 71, 75 on the front surface display panel 10.

As the electronic and physical connection structure between the second to fourth side surface display panels 120, 130, 140 and the front surface display panel 10 is identical to the aforementioned electronic and physical connection structure between the front surface display panel 10 and the first side surface display panel 110, explanation in this regard will be omitted.

FIG. 8 to FIG. 13 are diagrams illustrating examples of displays in various forms by utilizing a side surface display panel of a display apparatus according to an embodiment of the disclosure. In the disclosure, an image displayed on the front surface display panel 10 and the first to fourth side surface display panels 110, 120, 130, 140 may mean a moving image or an image.

Figure 8:
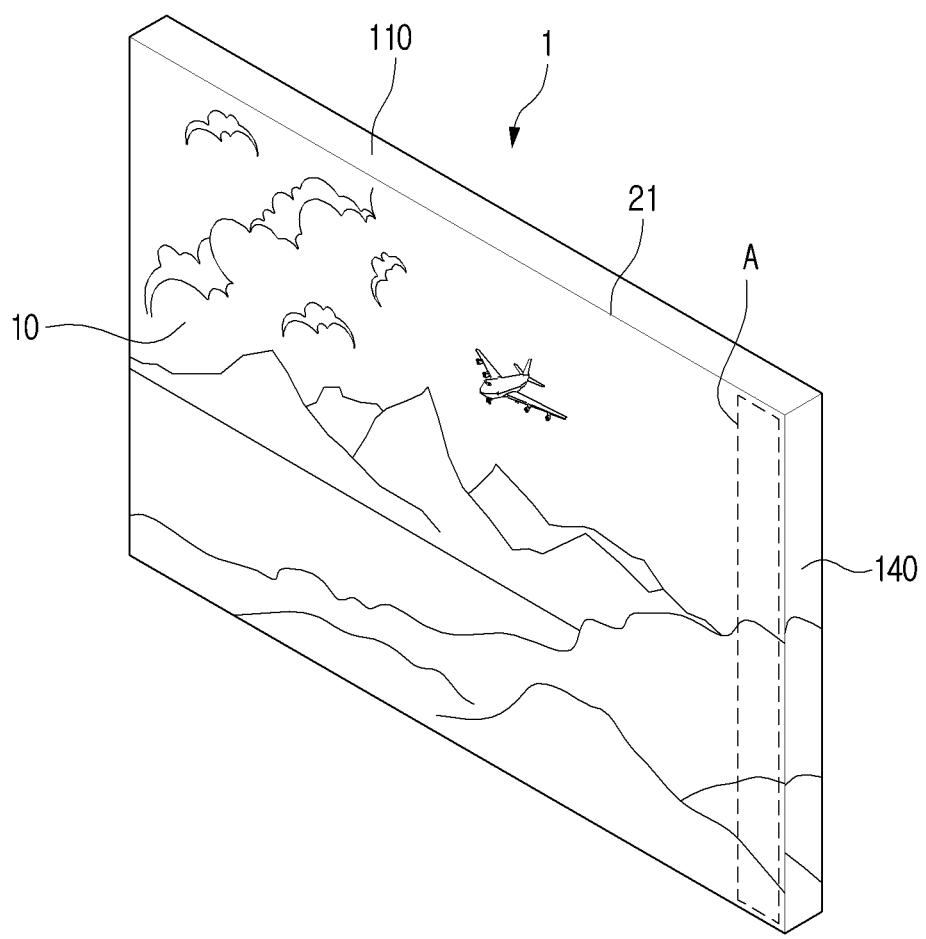
FIG. 8 to FIG. 13 are diagrams illustrating creations of displays in various forms by utilizing a side surface display panel of a display apparatus according to an embodiment of the disclosure.

Referring to FIG. 8, an image is displayed on the front surface display panel 10, and an image corresponding to a partial area that is being displayed on the front surface display panel 10 is simultaneously displayed on each of the first to fourth side surface display panels 110, 120, 130, 140 arranged in each side part of the front surface display panel 10, and accordingly, a stereoscopic effect similar to a 3D image can be felt from a 2D image, and thus a sense of immersion can be provided.

For example, an image identical to a partial area A (e.g., an area adjacent to the fourth side surface display panel 140) of an image that is being displayed on the entire front surface display panel 10 may be displayed. Likewise, on each of the first to third side surface display panels 110, 120, 130, images identical to adjacent partial areas of the image that is being displayed on the front surface display panel 10 may be displayed.

Figure 9:
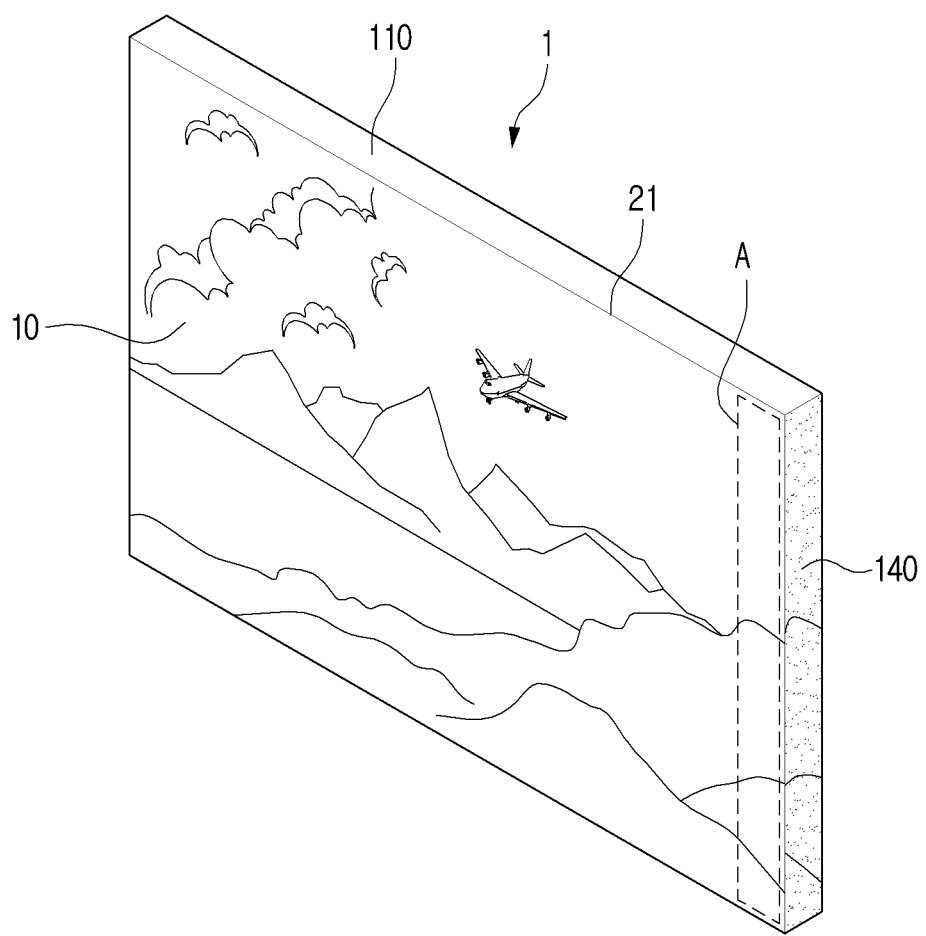

In this case, as in FIG. 9, a blur effect may be applied to the first to fourth side surface display panels 110, 120, 130, 140. Alternatively, on the first to fourth side surface display panels 110, 120, 130, 140, various filter effects (e.g., a monochrome effect, a distort effect, a noise effect, a texture effect, etc.) may be applied, not limited to a blur effect.

Figure 10:
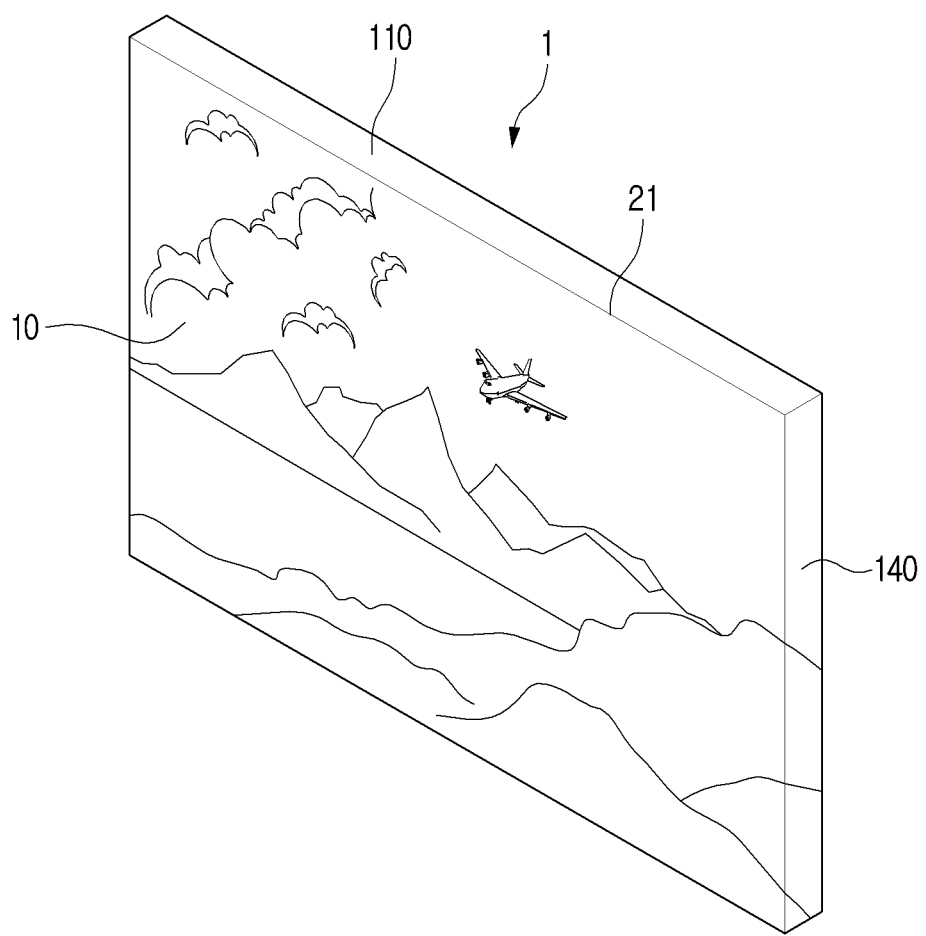

Referring to FIG. 10, on the first to fourth side surface display panels 110, 120, 130, 140, images that are continued with an image that is being displayed on the front surface display panel 10 may be respectively displayed. Accordingly, the image on the front surface display panel 10 may be extended and displayed stereoscopically, and thus a sense of immersion can be improved.

Figure 11:
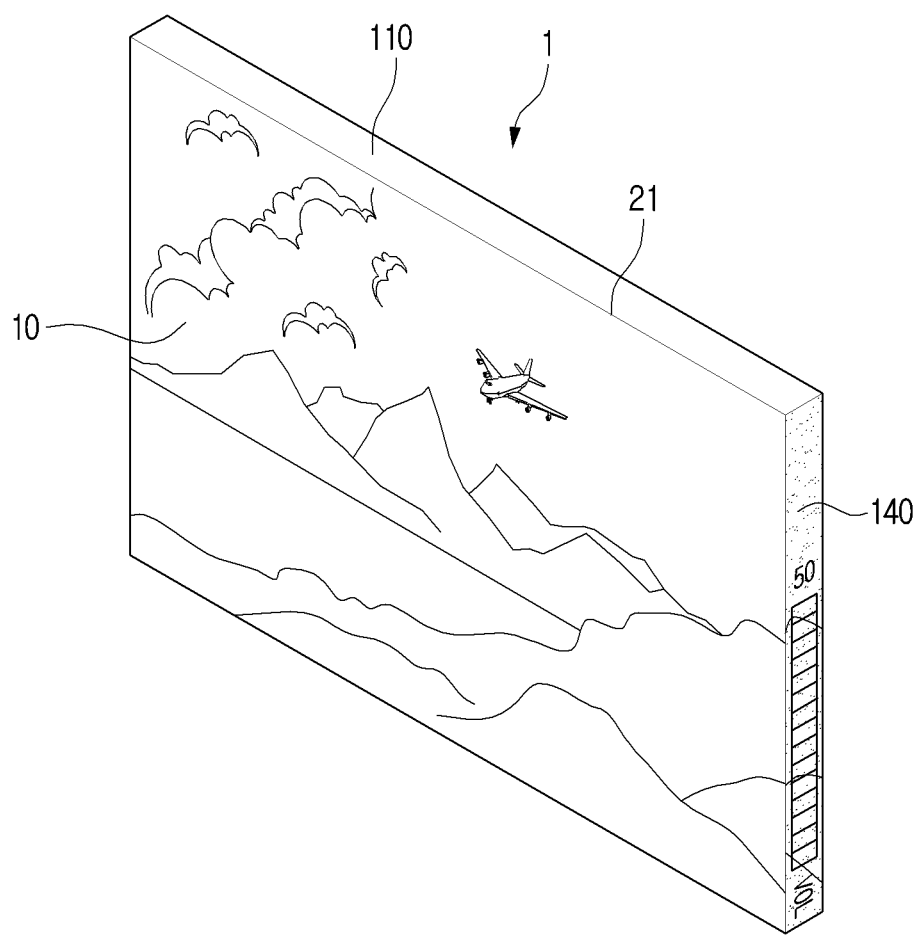

Referring to FIG. 11, on the fourth side surface display panel 140, an image different from an image that is being displayed on the front surface display panel 10 may be displayed. For example, on the fourth side surface display panel 140, a sound volume related to the image that is being displayed on the front surface display panel 10 may be displayed.

Alternatively, on the fourth side surface display panel 140, various information related to an image that is being displayed on the front surface display panel 10 such as channel information, a playlist, etc. may be displayed, not limited to a sound volume, and the information may be selectively displayed.

Alternatively, on the fourth side surface display panel 140, information not related to an image that is being displayed on the front surface display panel 10, for example, life information such as weather, time, etc. may be displayed.

Figure 12:
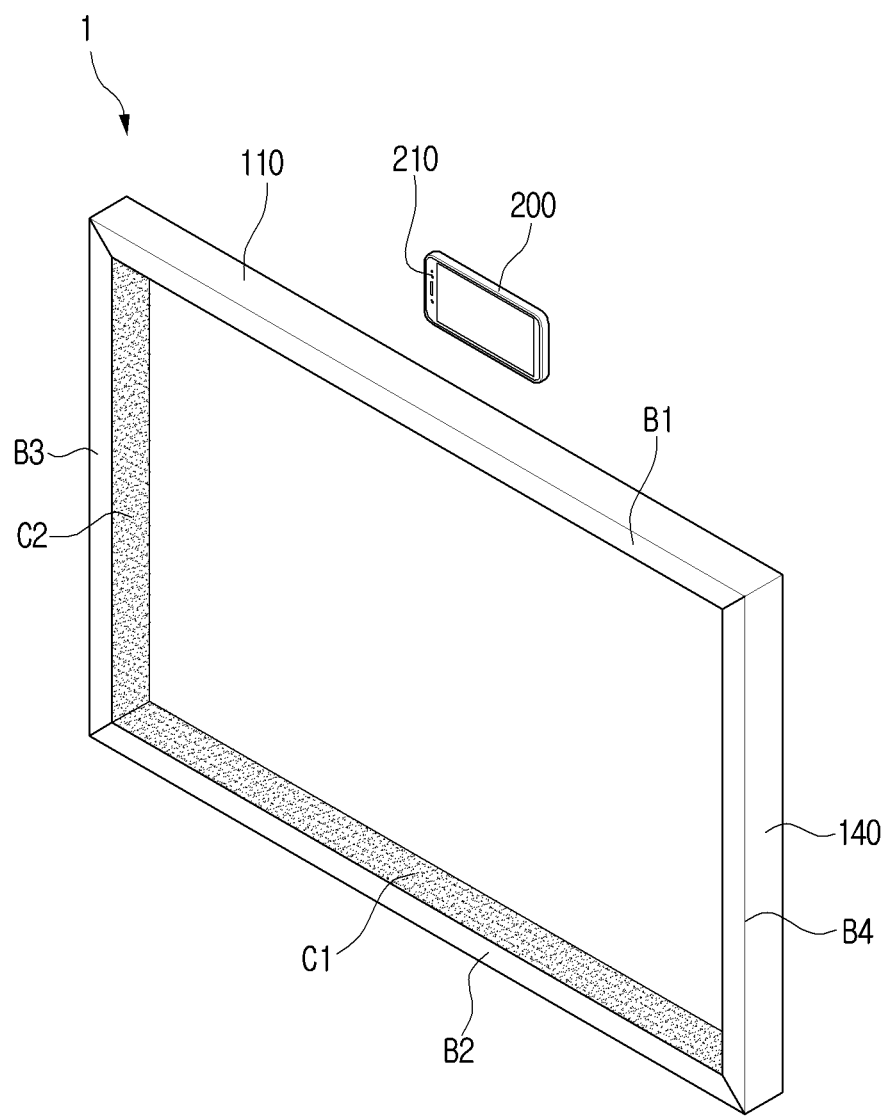
Figure 13:
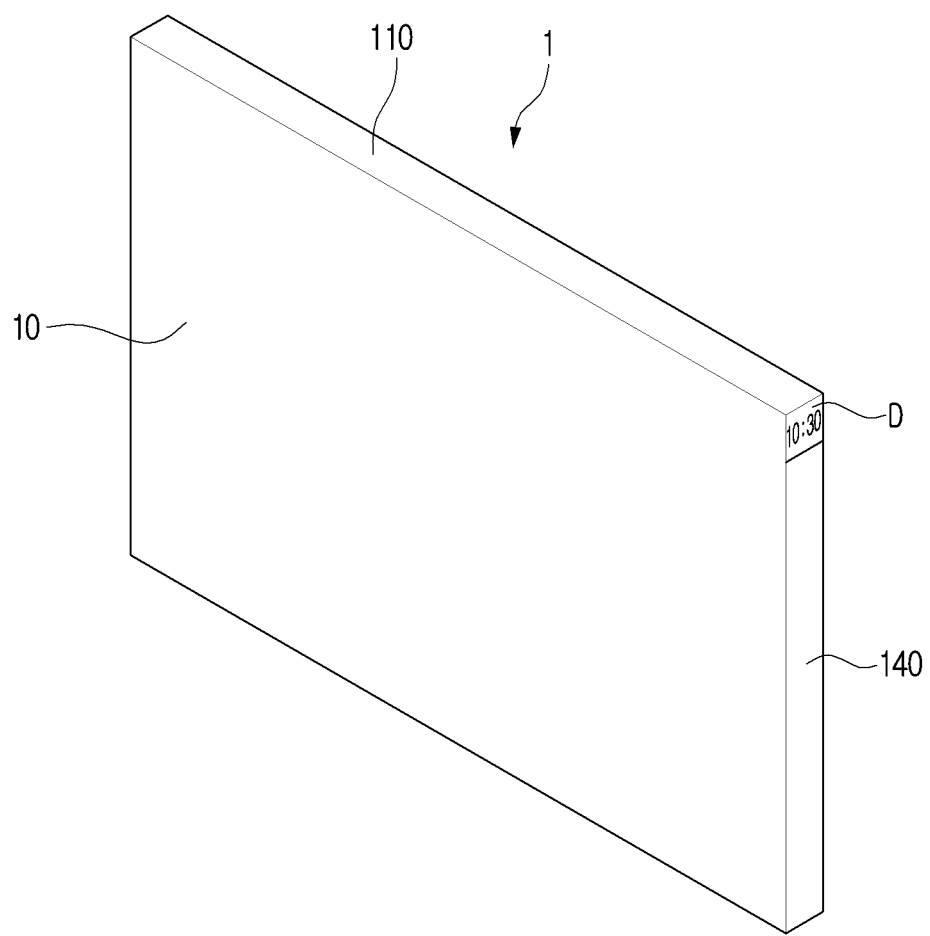

Referring to FIG. 12, a picture frame image may be displayed on the front surface display panel 10 and the first to fourth side surface display panels 110, 120, 130, 140, and the rims of the display apparatus 1 may be expressed as a virtual picture frame. In this case, picture frame images in various forms expressing various colors, textures, and patterns may be selectively displayed on the front surface display panel 10 and the first to fourth side surface display panels 110, 120, 130, 140.

Meanwhile, the display apparatus 1 may include a camera apparatus. In the disclosure, the camera apparatus may be a mobile apparatus 200 including a camera module 210 as in FIG. 12. Alternatively, the camera apparatus may be a built-in camera included in the display apparatus 1 or an external camera arranged on the outside of the display apparatus 1.

In this case, the mobile apparatus 200 may recognize a user in front of the display apparatus 1 with the camera module 210, and transmit a recognition signal to the processor 12. The processor 12 may display an image expressing the inner depth of a virtual picture frame on the front surface display panel 10 based on the received recognition signal. Accordingly, a user can feel a sense of space through the image displayed on the front surface display panel 10.

In the description of the aforementioned embodiments, each of the first to fourth side surface display panels 110, 120, 130, 140 displays an image in the entire area of the side surface display panel. However, the disclosure is not limited thereto, and as in FIG. 13, an image (e.g., life information, etc.) may be displayed only in a partial area D of the fourth side surface display panel 140, and a black screen may be displayed in the remaining areas. Here, the black screen may be implemented by turning off a plurality of inorganic light emitting diodes (e.g., micro LEDs) located in the remaining areas.

Although not illustrated in the drawings, the first to third side surface display panels 120, 130, 140 may also display an image in a partial area, and display a black screen in the remaining areas.

In the aforementioned embodiments, it was described that the screen parts 110a, 120a, 130a, 140a of the first to fourth side surface display panels 110, 120, 130, 140 are respectively arranged in a right angle or an angle almost close to a right angle based on the screen part 10a of the front surface display panel 10, but the disclosure is not limited thereto. For example, the screen parts 110a, 120a, 130a, 140a of the first to fourth side surface display panels 110, 120, 130, 140 may respectively be arranged in an angle which is not a right angle with respect to the screen part 10a of the front surface display panel 10. Hereinafter, various embodiments in this regard will be described with reference to the drawings.

Figure 14A:
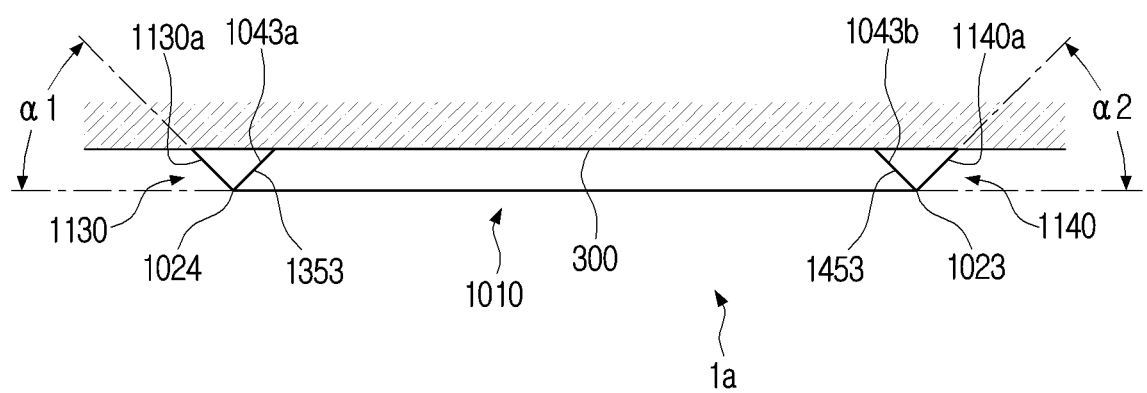
FIG. 14A is a diagram illustrating a display apparatus according to another embodiment of the disclosure, and is a schematic plan view illustrating an example wherein a side surface display panel is arranged to be tilted toward a rear part with respect to a front surface display panel.
Figure 14A:
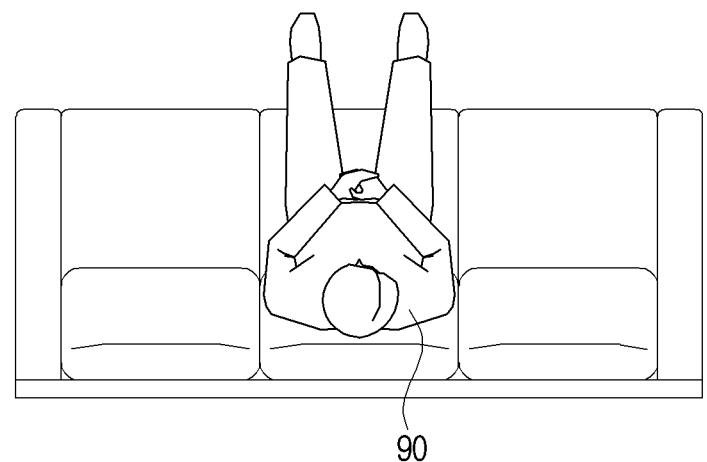
Figure 14B:
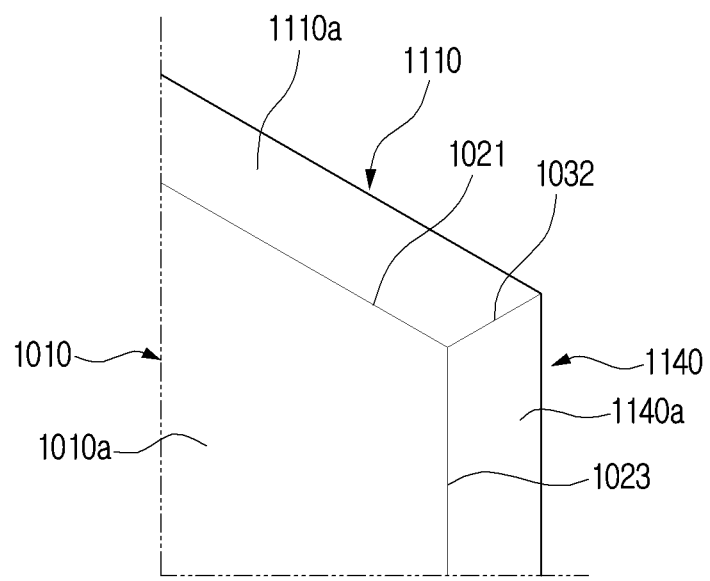
FIG. 14B is a front view illustrating a part of the display apparatus illustrated in FIG. 14A.

FIG. 14A is a diagram illustrating a display apparatus according to another embodiment of the disclosure, and is a schematic plan view illustrating an example wherein a side surface display panel is arranged in an obtuse angle with respect to a front surface display panel, and FIG. 14B is a front view illustrating a part of the display apparatus illustrated in FIG. 14A.

Referring to FIG. 14A, in the display apparatus 1a installed on the wall 300, the screen parts 1130a, 1140a of the third and fourth side surface display panels 1130, 1140 respectively connected to the left side and the right side of the front surface display panel 1010 may respectively be arranged to be tilted in first and second acute angles (α1, α2) toward the rear part of the front surface display panel 1010 based on the screen part 1010a of the front surface display panel 1010.

The screen parts of the first and second side surface display panels not illustrated in FIG. 14A may respectively be connected to the upper side and the lower side of the front surface display panel 1010, and they may be arranged to be tilted in acute angles toward the rear part of the front surface display panel 1010 based on the screen part 1010a of the front surface display panel 1010.

In this case, all of the screen parts of the first to fourth side surface display panels may be arranged to be tilted in the same acute angle with respect to the screen part of the front surface display panel.

Accordingly, the first to fourth side surface display panels may smoothly connect between the screen part 1010a of the front surface display panel 1010 projected to a specific height from the wall 300 and the wall 300. Accordingly, a sense of difference that a user 90 may feel due to the stepped pulley between the screen part 1010a of the front surface display panel 1010 and the wall 300 can be resolved.

Referring to FIG. 14B, the boundaries 1032 of the first side surface display panel 1110 and the fourth side surface display panel 1140 adjacent to each other may adhere with each other. Also, the boundary 1021 of the front surface display panel 1010 and the first side surface display panel 1110 and the boundary 1023 of the front surface display panel 1010 and the fourth side surface display panel 1140 may adhere with each other.

Accordingly, the screen part 1010a of the front surface display panel 1010, the screen part 1110a of the first display panel 1110, and the screen part 1140a of the fourth display panel 1140 may be connected without breakage between them. The boundaries of the screen parts of the second and third display panels not illustrated in FIG. 14B may also adhere with each other, and the screen parts may be connected with the screen part 1010a of the front surface display panel 1010 without breakage between them.

Through the structure wherein the screen parts of the respective display panels adjacent to one another are sequentially continued without breakage, the user 90 may recognize the screen of the display apparatus 1a as one screen that is stereoscopically arranged from the wall 300.

In FIG. 14A, reference numerals 1043a and 1043b not explained are the mounting surfaces of the front surface display panel 1010, the reference numeral 1353 is the mounting surface of the third side surface display panel 1130, and the reference numeral 1453 is the mounting surface of the fourth side surface display panel 1140.

Figure 15:
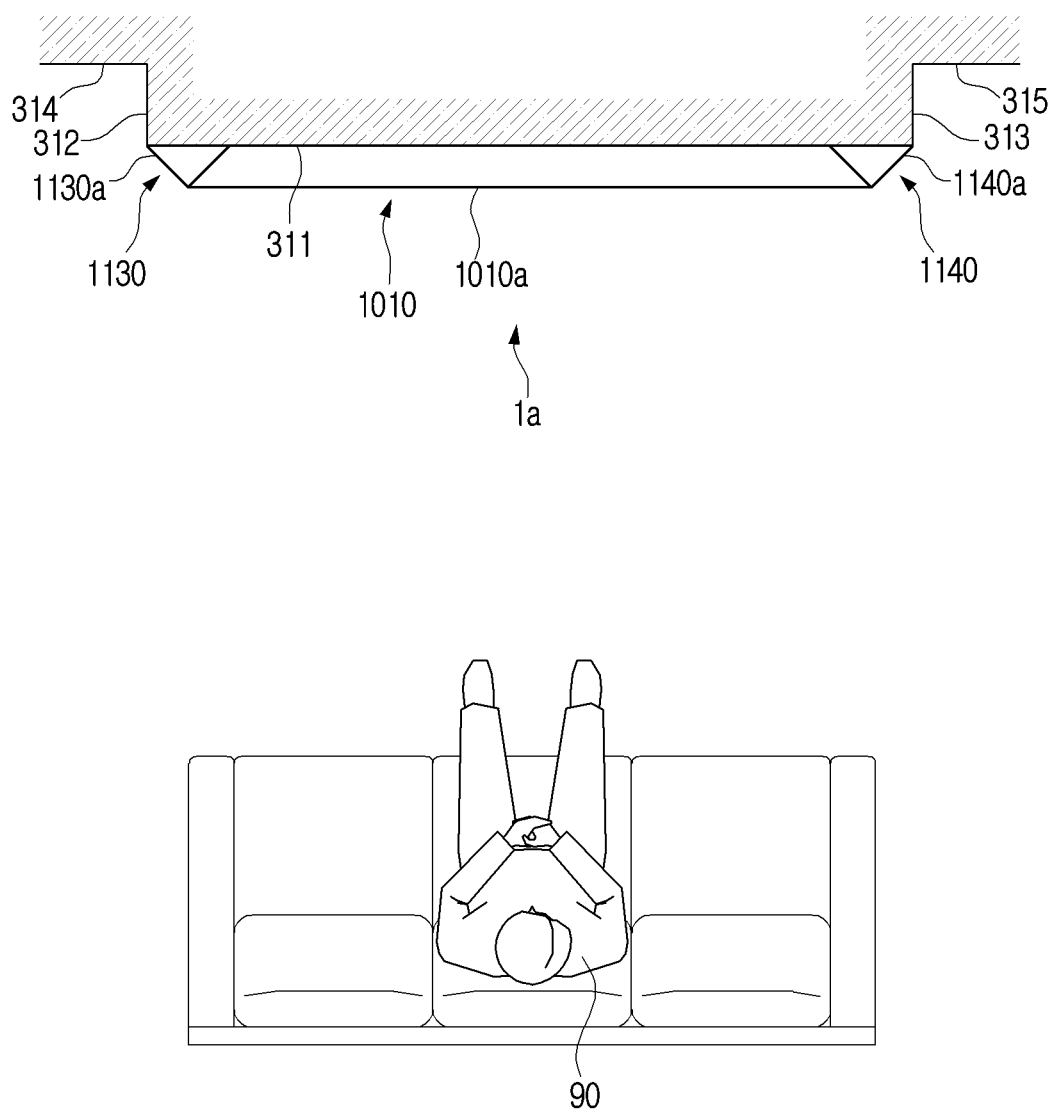
FIG. 15 is a schematic plan view illustrating an example wherein a display apparatus according to another embodiment of the disclosure is installed on a projected wall surface.

FIG. 15 is a schematic plan view illustrating an example wherein a display apparatus according to another embodiment of the disclosure is installed on a projected wall surface.

Referring to FIG. 15, the display apparatus 1a may be installed in a part 311 projected to a specific height from a part 314, 315 of the wall. The wall may naturally be projected according to the construction condition of the building, or it may be artificially projected by attaching a separate member for the interior.

In this case, the end part of the screen part 1130a of the third side surface display panel 1130 may coincide with one side part 312 of the wall, and the end part of the screen part 1140a of the fourth side surface display panel 1140 may coincide with the other side part 313 of the wall.

Accordingly, the screen part 1110a of the front surface display panel 1110 may give a feeling that it is naturally continued with the one side part 312 and the other side part 313 of the wall through the screen parts 1130a, 1140a of the third and fourth side surface display panels 1130, 1140, and thus it may give a sense of unity with the projected wall.

The display apparatus 1a according to another embodiment of the disclosure may be installed not only on a projected wall surface but also on a column.

Figure 16:
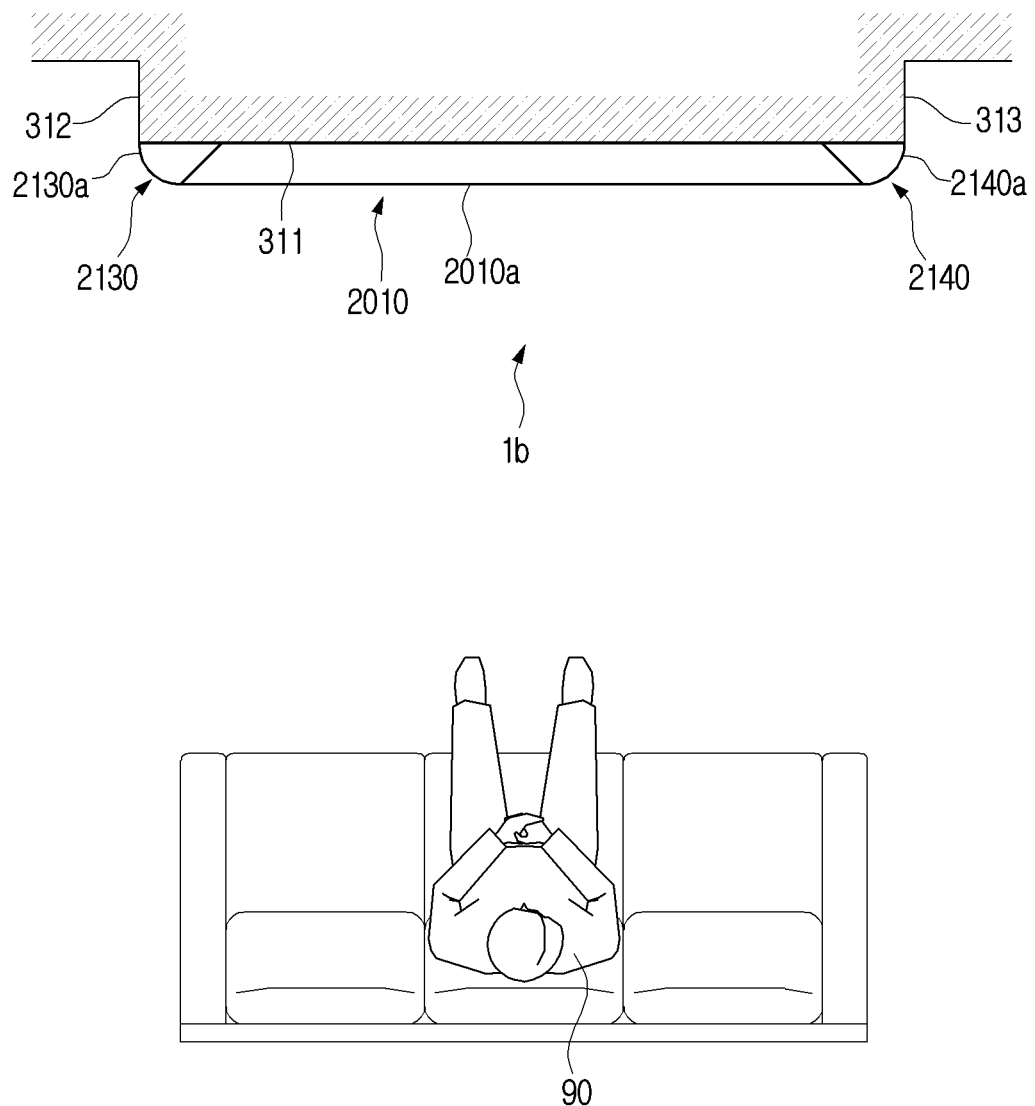
FIG. 16 is a diagram illustrating a display apparatus according to still another embodiment of the disclosure, and is a schematic plan view illustrating an example wherein a display apparatus is installed on a projected wall surface.

FIG. 16 is a diagram illustrating a display apparatus according to still another embodiment of the disclosure, and is a schematic plan view illustrating an example wherein a display apparatus is installed on a projected wall surface.

Referring to FIG. 16, a display apparatus 2010 may be installed on a projected wall surface 311 as described above.

In this case, the screen parts 2130a, 2140a of the third and fourth display panels 2130, 2140 continued with the left side and the right side of the front surface display panel 2010 may constitute a curved surface having a specific curvature.

The screen parts 2130a, 2140a of the third and fourth display panels 2130, 2140 may respectively be sequentially continued with the screen part 2010a of the front surface display panel 2010. Also, the end parts of the screen parts 2130a, 2140a of the third and fourth display panels 2130, 2140 may respectively coincide with one side part 312 and the other side part 313 of the wall.

The display apparatus 1b according to still another embodiment of the disclosure may be installed not only on a projected wall surface but also on a column.

Figure 17:
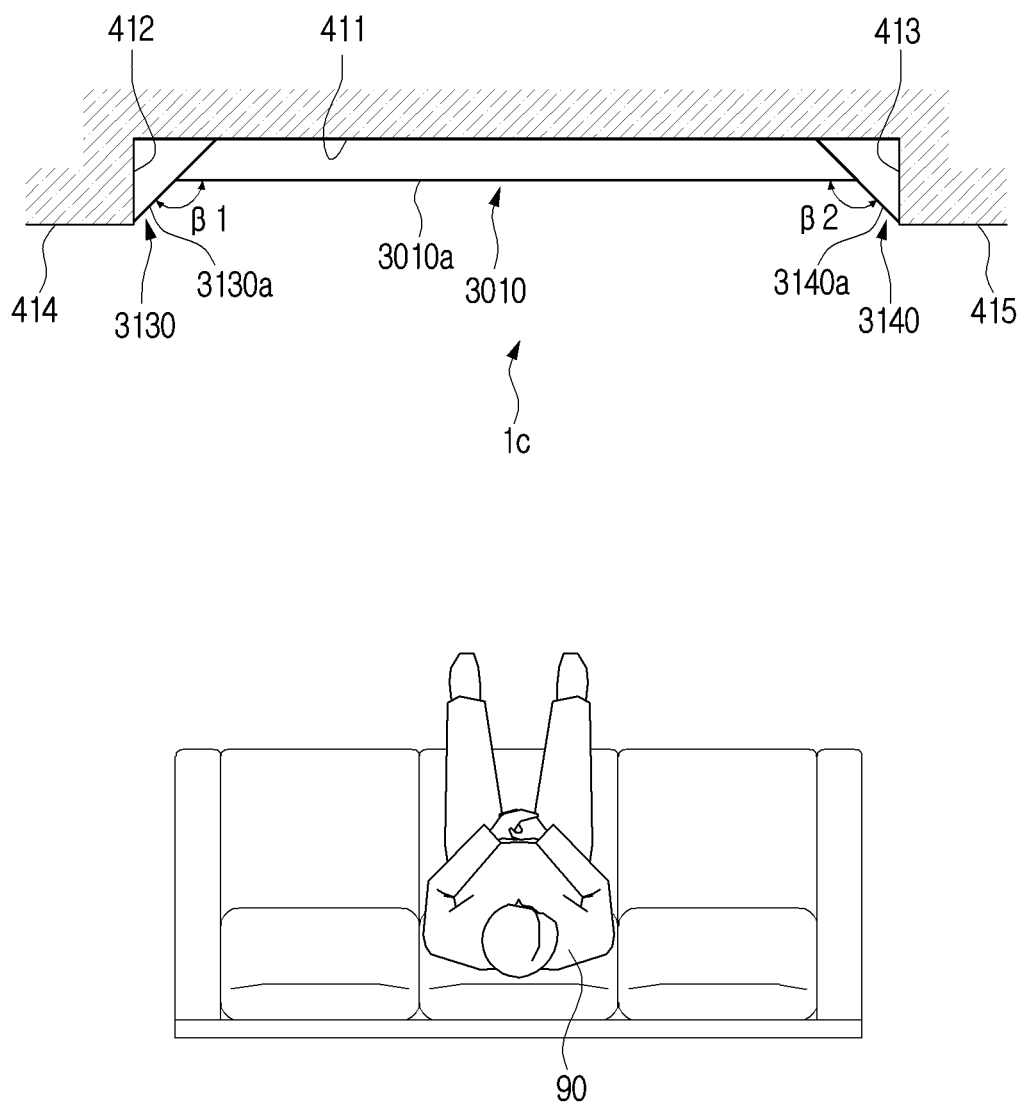
FIG. 17 is a diagram illustrating a display apparatus according to still another embodiment of the disclosure, and is a schematic plan view illustrating an example wherein a display apparatus is installed on a punched wall surface.

FIG. 17 is a diagram illustrating a display apparatus according to still another embodiment of the disclosure, and is a schematic plan view illustrating an example wherein a display apparatus is installed on a punched wall surface.

Referring to FIG. 17, a display apparatus 1c may be installed on a wall surface 411 in a punched shape at a specific depth. In this case, in the display apparatus 1c, one part of each of the third and fourth display panels 3130, 3140 continued with the left side and the right side of the front surface display panel 3010 may be projected by a specific height toward the front part of the front surface display panel 3010 so that the display apparatus 1c can give a sense of unity with the punched wall surface without a sense of difference.

For example, the third side surface display panel 3130 may be installed on the punched wall surface 411 and the wall surface 412 on one side, and the screen part 3031a may be sequentially continued with the screen part 3010a of the front surface display panel 3010. In this case, the screen part 3031a of the third side surface display panel 3130 may be arranged to be tilted at a first obtuse angle β1 toward the front part of the front surface display panel 3010 based on the screen part 3010a of the front surface display panel 3010. Also, the end part of the third side surface display panel 3130 may coincide with the wall surface 414.

Accordingly, the third side surface display panel 3130 may overcome a sense of difference due to a stepped pulley between the wall surface 414 and the screen part 3010a of the front surface display panel 3010, and the display apparatus 1c may constitute harmony in terms of design with respect to the installed place.

The fourth side surface display panel 3140 may be arranged on the wall surface 413 on the other side of the punched wall surface 411, and the screen part 3140a may be sequentially continued with the screen part 3010a of the front surface display panel 3010. In this case, the screen part 3140a of the fourth side surface display panel 3140 may be arranged to be titled at a second obtuse angle β2 toward the front part of the front surface display panel 3010 based on the screen part 3010a of the front surface display panel 3010. Also, the end part of the fourth side surface display panel 3140 may coincide with the wall surface 413. Accordingly, the fourth side surface display panel 3140 may overcome a sense of difference due to a stepped pulley between the wall surface 413 and the screen part 3010a of the front surface display panel 3010.

In an embodiment according to the disclosure, parts of the third and fourth side surface display panels 3130, 3140 may consist of forms projected toward the front part of the front surface display panel 3010 more than the screen part 3010a of the front surface display panel 3010.

Figure 18:
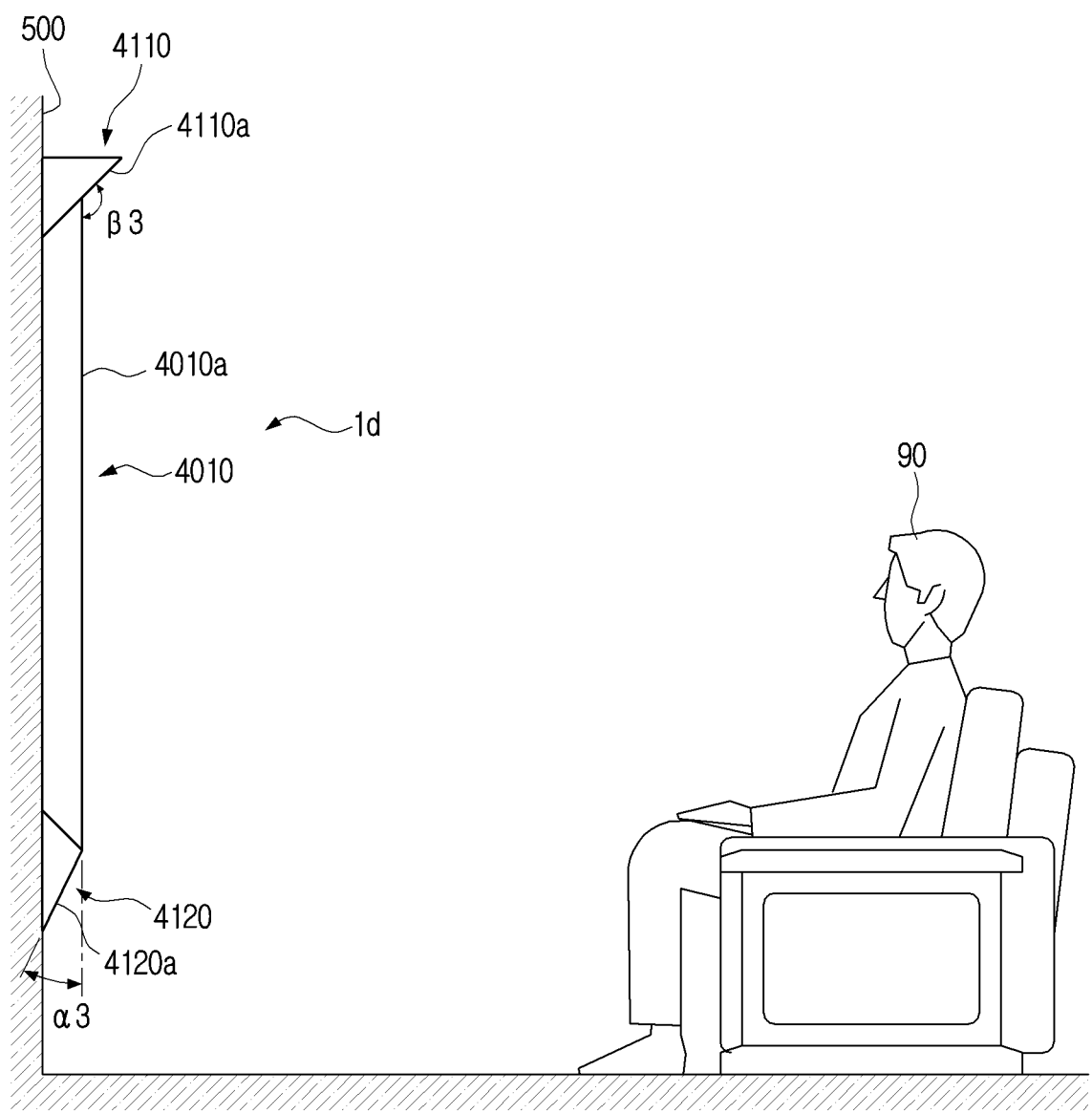
FIG. 18 is a diagram illustrating a display apparatus according to still another embodiment of the disclosure, and is a schematic plan view illustrating an example wherein side surface display panels are arranged at different angles from one another with respect to a front surface display panel.

FIG. 18 is a diagram illustrating a display apparatus according to still another embodiment of the disclosure, and is a schematic plan view illustrating an example wherein side surface display panels are arranged at different angles from one another with respect to a front surface display panel.

Referring to FIG. 18, in the display apparatus 1d, the first side surface display panel 4110 connected with the upper side of the front surface display panel 4010 may be projected more than the screen part 4010a of the front surface display panel 4010 at a specific height.

The first side surface display panel 4110 may be arranged to be tilted at a third obtuse angle β3 toward the front part of the front surface display panel 4010 based on the screen part 4010a of the front surface display panel 4010.

Accordingly, the display apparatus 1d may extend the screen part 10a of the front surface display panel through the first side surface display panel 4110 connected with the upper side of the front surface display panel 4010. Also, as the screen part 4110a of the first side surface display panel 4110 is arranged to be tilted toward the side of the user 90, the user may be made to feel a sense of immersion.

Also, in the display apparatus 1d, the screen part 4120a of the second side surface display panel 4120 connected with the lower side of the front surface display panel 4010 may be arranged to be tilted at a third acute angle α3 toward the rear part of the front surface display panel 4010 based on the screen part 4010a of the front surface display panel 4010.

As described above, the front side surface display panel 4110 and the second side surface display panel 4120 consist of different shapes, and accordingly, the upper part and the lower part of the display apparatus 1d may constitute asymmetry.

Although not illustrated in the drawings, the third and fourth side surface display panels connected with the left side and the right side of the front surface display panel 4010 may consist of shapes identical to the first side surface display panel 4110, or shapes identical to the second side surface display panel 4120.

As the side surface display panels according to the aforementioned embodiments are fixed on the front surface display panel 10, the screen parts of the side surface display panels may be arranged only at predetermined angles with respect to the screen part of the front surface display panel 10. However, the disclosure is not limited thereto, and the disclosure may include a structure wherein an angle of a screen part of a side surface display panel can vary with respect to a screen part of a front surface display panel, like a display apparatus according to an embodiment of the disclosure that will be described below.

Figure 19:
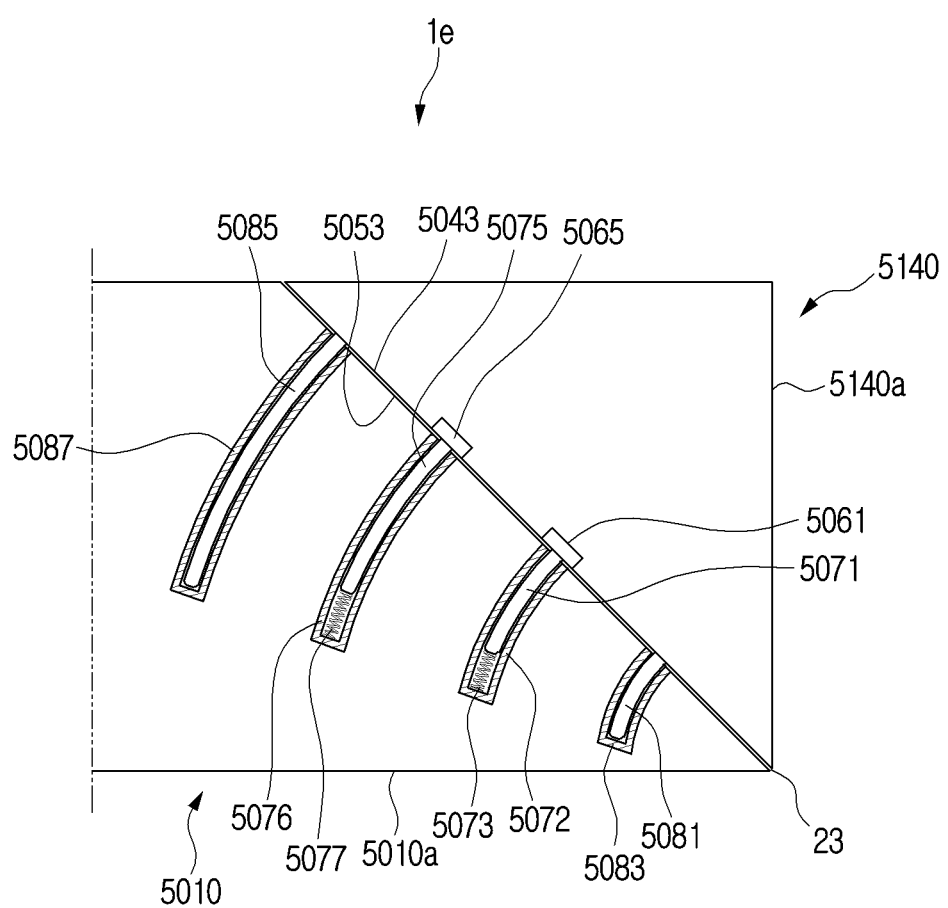
FIG. 19 and FIG. 20 are diagrams illustrating a display apparatus according to still another embodiment of the disclosure, and are schematic views illustrating examples wherein an arrangement angle of a side surface display panel can vary with respect to a front surface display panel.
Figure 20:
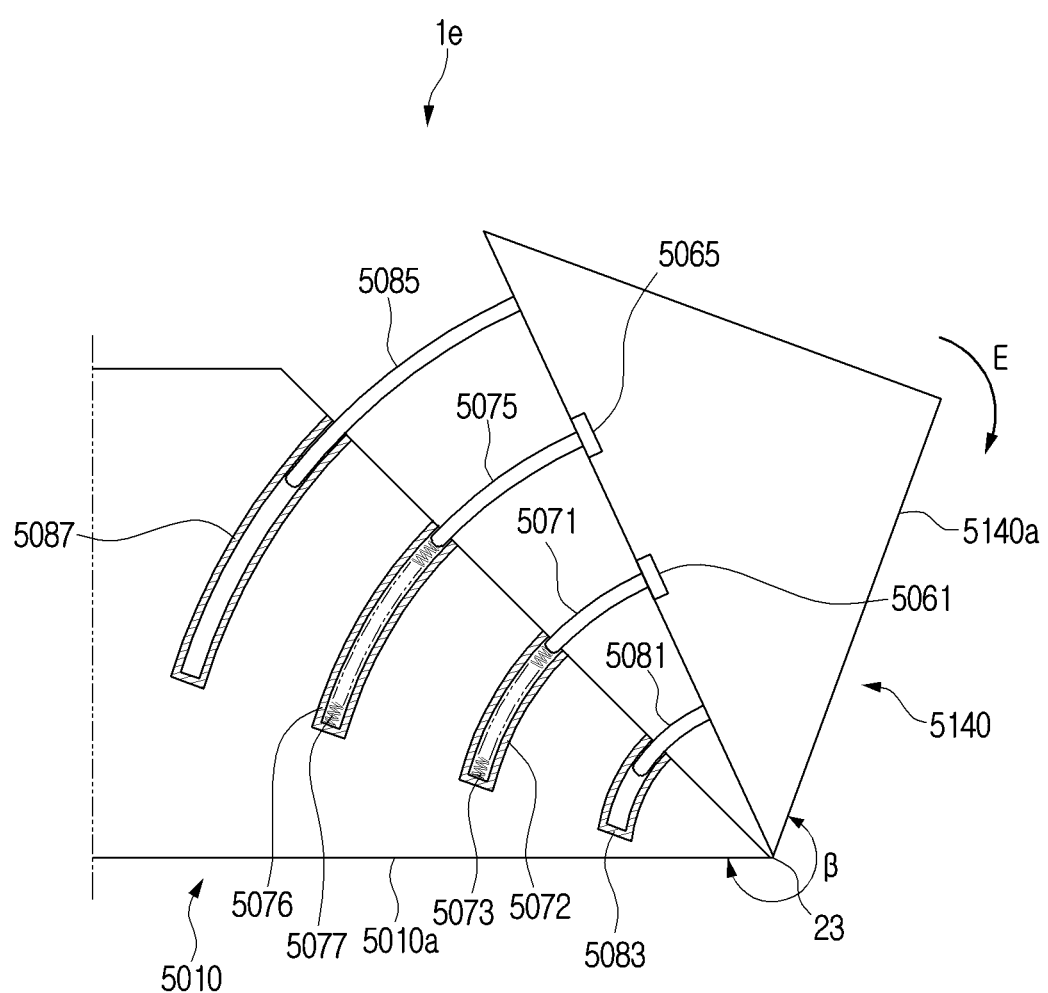

FIG. 19 and FIG. 20 are diagrams illustrating a display apparatus according to still another embodiment of the disclosure, and are schematic views illustrating examples wherein an arrangement angle of a side surface display panel can vary with respect to a front surface display panel.

The display apparatus 1e according to still another embodiment of the disclosure may include first to fourth side surface display panels such that arrangement angles can respectively vary on the front surface display panel 5010 and the upper, lower, left, and right sides of the front surface display panel. In this case, all of the first to fourth side surface display panels are connected with the front surface display panel 5010 to be variable through the same connecting structure. Accordingly, hereinafter, only the connecting structure between the front surface display panel 5010 and the fourth side surface display panel 5140 will be described.

Referring to FIG. 19, the fourth side surface display panel 5140 may be connected with the front surface display panel 5010 so as to be pivotable in a clockwise direction and a counter-clockwise direction. In this case, the rotation center of the fourth side surface display panel 5140 may be the boundary 23 between the front surface display panel 5010 and the fourth side surface display panel 5140. Accordingly, in case the fourth side surface display panel 5140 pivots in a clockwise direction or a counter-clockwise direction, the space between the front surface display panel 5010 and the fourth side surface display panel 5140 may not be widened. Accordingly, a state wherein the screen part 5010a of the front surface display panel 5010 and the screen part 5140a of the fourth side surface display panel 5140 are sequentially continued may be maintained.

In the fourth side surface display panel 5140, a first guide rod 5081 and a second guide rod 5085 may be arranged on the mounting surface 5053 of the housing at an interval. In this case, the first and second guide rods may have curvatures corresponding to a pivoting radius of the side surface display panel 5140.

The first and second guide rods 5081, 5085 may have the same curvature. The first guide rod 5081 may be arranged to be adjacent to the boundary 23 of the front surface display panel 5010 and the fourth side surface display panel 5140, and the second guide rod 5085 may be arranged in a location farther from the boundary 23 than the first guide rod 5081.

On the inner side of the housing of the front surface display panel 5010, a first guide supporter 5083 into which the first guide rod 5081 is slidably inserted, and a second guide supporter 5087 into which the second guide rod 5085 is slidably inserted may be arranged.

The first guide supporter 5083 may have the same curvature as the first guide rod 5081, and the second guide supporter 5085 may have the same curvature as the second guide rod 5085.

A part of the first terminal 5061 may be exposed so as to be connectable with the second terminal 5071, and the remaining parts may be buried in the housing of the fourth side surface display panel 5140 so as not to be projected more than the mounting surface 5053 of the fourth side surface display panel 5140. A part of the third terminal 5065 may also be exposed so as to be connectable with the fourth terminal 5075, and the remaining parts may be buried in the housing of the fourth side surface display panel 5140 so as not to be projected more than the mounting surface 5053 of the fourth side surface display panel 5140.

The second terminal 5071 may have the same curvature as the first and second guide rods 5081, 5085. The second terminal 5071 may be elastically arranged so as to be projected more than the mounting surface 5043 of the housing of the front surface display panel 5010. For example, the second terminal 5071 may be slidably inserted into the first guide member 5072 buried in the housing of the front surface display panel 5010, and may be elastically supported by the elastic member 5073 arranged on the inner side of the first guide member 5072. In this case, the first guide member 5072 may have the same curvature as the second terminal 5071. The second terminal 5071 may be connected with the first terminal 5061 in a state wherein the fourth side surface guide panel 5140 is connected with the front surface display panel 5010.

The fourth terminal 5075 may have the same curvature as the second terminal 5071. The fourth terminal 5075 may be elastically arranged so as to be projected more than the mounting surface 5043 of the housing of the front surface display panel 5010. For example, the fourth terminal 5075 may be slidably inserted into the second guide member 5076 buried in the housing of the front surface display panel 5010, and may be elastically supported by the elastic member 5077 arranged on the inner side of the second guide member 5076. In this case, the second guide member 5076 may have the same curvature as the fourth terminal 5075. The fourth terminal 5075 may be connected with the third terminal 5071 in a state wherein the fourth side surface guide panel 5140 is connected with the front surface display panel 5010.

Accordingly, in case the fourth side surface display panel 5140 pivots in an E direction centered around the boundary 23 and the screen part 5010a of the front surface display panel 5010 and the screen part 5140a of the fourth side surface display panel 5140 vary to a specific angle β, as in FIG. 20, each of the second and fourth terminals 5071, 5075 may continuously maintain a connected state with the first and third terminals 5061, 5065 by the elastic force of the elastic members 5073, 5077. Accordingly, the first terminal 5061 and the second terminal 5071, and the third terminal 5065 and the fourth terminal. 5075 may respectively constitute an electrically stable connection.

Figure 21:
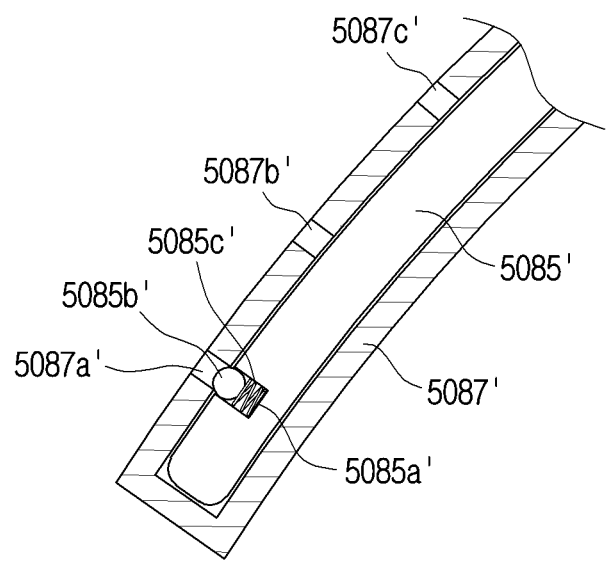
FIG. 21 is a schematic view illustrating a configuration wherein an arrangement angle of a side surface display panel can be fixed with respect to a front surface display panel.

FIG. 21 is a schematic view illustrating a configuration wherein an arrangement angle of a side surface display panel can be fixed with respect to a front surface display panel.

The display apparatus 1e according to still another embodiment of the disclosure may include a configuration wherein the side surface display panel 5140 can be fixed at a specific angle with respect to the front surface display panel 5010.

Referring to FIG. 21, a sliding groove 5085a' may be provided in the rear end part of the second guide rod 5085', and a fixing ball 5085b' elastically supported by an elastic member 5085c' may be included in the sliding groove 5085a'.

In this case, a plurality of fixing holes 5087a', 5087b', 5087c' to which a part of the fixing ball 5085b' can be inserted and fixed may be formed at specific intervals on the second guide supporter 5087'. In FIG. 21, three fixing holes are illustrated, but the number of fixing holes is not limited thereto, and three or more fixing holes may be formed along the second guide supporter 5087'. In addition, the intervals between the fixing holes may be arranged as specific intervals, but the disclosure is not limited thereto.

Through such a configuration, the side surface display panel 5140 can maintain a varied angle with respect to the front surface display panel 5010.

Although not illustrated in the drawings, the display apparatus 1e according to still another embodiment of the disclosure may connect the front surface display panel 5010 and the side surface display panel 5140 with a free stop hinge. In this case, the aforementioned fixing configuration using the first and second guide supporters 5081, 5085 and the fixing ball 5087a' may be omitted.

The aforementioned angle varying configuration of a side surface display panel is a method wherein a user varies an angle of a side surface display panel by directly pivoting a side surface display. In the disclosure, varying of an angle of a side surface display panel can be implemented by an electric method other than such a method.

For this, a driving apparatus (not shown), for example, a linear actuator, etc. may be arranged between a front surface display panel and a side surface display panel. In this case, one end of the linear actuator may be pivot-connected to the front surface display panel, and the other end may be pivot-connected to the side surface display panel. At least one linear actuator may be applied.

For example, a user may transmit a control signal to the processor 5 through a manipulation part (e.g., a manipulation button, a jog wheel, a buried joystick, a finger mouse, etc.) provided on a remote controller (not shown). The processor 5 may operate the linear actuator in response to the control signal, and vary the angle of the side surface display panel.

Meanwhile, in the disclosure, in both cases of before the angle of the side surface display panel 5140 varied and after the angle varied, the screen part 5010a of the front surface display panel 5010 and the screen part 5140*a* of the side surface display panel 5140 may be arranged to be sequentially continued without being separated. However, the disclosure does not have to be restricted thereto, and while the angle of the side surface display panel 5140 is varying or after the angle varied, the screen part 5010*a* of the front surface display panel 5010 and the screen part 5140*a* of the side surface display panel 5140 may be separated by a specific interval. The specific interval may be an interval by which images displayed on the respective screen parts 5010*a*, 5140*a* are not noticeably recognized as an isolated state.

So far, preferred embodiments of the disclosure have been shown and described, but the disclosure is not limited to the aforementioned specific embodiments, and it is apparent that various modifications may be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. A display apparatus comprising:
    a front surface display panel including a side part that has a first mounting surface that is tilted, and at least one terminal arranged in the first mounting surface; and
    a side surface display panel having a second mounting surface that is tilted so as to correspond to the first mounting surface, and the side surface display panel including at least one terminal arranged in the second mounting surface,
    wherein the side surface display panel is connected to the side part of the front surface display panel with the first mounting surface and the second mounting surface facing each other, and the at least one terminal arranged in the first mounting surface is electronically connected to the at least one terminal arranged in the second mounting surface, respectively, to electronically connect the front surface display panel and the side surface display panel.

2. The display apparatus of claim 1, wherein
    the side surface display panel has a screen part,
    the front surface display panel has a screen part, and
    the screen part of the side surface display panel extends toward a rear of the display apparatus at a right angle from the screen part of the front surface display panel.

3. The display appliance of claim 1, wherein
    the side surface display panel has a screen part,
    the front surface display panel has a screen part, and
    the screen part of the side surface display panel extends toward a rear of the display apparatus at an acute angle from the screen part of the front surface display panel.

4. The display apparatus of claim 1, wherein
    the side surface display panel has a screen part,
    the front surface display panel has a screen part, and
    the screen part of the side surface display panel extends toward a front of the display apparatus at an obtuse angle from the screen part of the front surface display panel.

5. The display appliance of claim 1, wherein
    the side surface display panel has a screen part,
    the front surface display panel has a screen part, and
    the screen part of the side surface display panel sequentially continues with the screen part of the front surface display panel.

6. The display appliance of claim 1, wherein the side surface display panel is configured to receive a control signal from, and to be supplied with power from, the front surface display panel through the at least one terminal arranged in the first mounting surface and the at least one terminal arranged in the second mounting surface.

7. The display appliance of claim 6, wherein
    the at least one terminal arranged in the first mounting surface includes:
        a first terminal, and
        a second terminal, and
    the at least one terminal arranged in the second mounting surface includes:
        a third terminal that is connected to the first terminal to receive a control signal from the front surface display panel, and
        a fourth terminal that is connected to the second terminal to be supplied with power from the front surface display panel.

8. The display appliance of claim 7, wherein:
    one terminal of the first terminal and the third terminal elastically contacts the other terminal of the first terminal and the third terminal, and
    one terminal of the second terminal and the fourth terminal elastically contacts the other terminal of the first terminal and the third terminal.

9. The display appliance of claim 1, further comprising:
    a plurality of first magnets coupled to one mounting surface of the first mounting surface and the second mounting surface, and
    a plurality of second permanent magnets respectively corresponding to the plurality of first permanent magnets coupled to the other mounting surface of the first mounting surface and the second mounting surface.

10. The display appliance of claim 1, further comprising:
    a plurality of coupling projections on one mounting surface of the first mounting surface and the second mounting surface, and
    a plurality of coupling holes on the other mounting surface of the first mounting surface and the second mounting surface,
    wherein the plurality of coupling projections are snap-coupled to the plurality of coupling holes.

11. The display appliance of claim 1, wherein the side surface display panel is pivotable in a clockwise direction or in a counter-clockwise direction centered around a boundary with the front surface display panel.

12. The display apparatus of claim 11, further comprising:
    a guide rod that pivotably connects the side surface display panel to the front surface display panel,
    wherein the guide rod has a curvature corresponding to a pivoting radius of the side surface display panel.

13. The display apparatus of claim 11, wherein electronic connection of the side surface display panel with the front surface display panel is maintained within a pivotable range of the side surface display panel.

14. The display apparatus of claim 13, wherein
    the at least one terminal arranged in the first mounting surface includes a first terminal and a second terminal,
    the at least one terminal arranged in the second mounting surface includes a third terminal connected to the first terminal to receive a control signal from the front surface display panel, and a fourth terminal connected to the second terminal to be supplied with power from the front surface display panel,
    one terminal of the first terminal and the third terminal elastically contacts the other terminal of the first terminal and the third terminal, and one terminal of the second terminal and the fourth terminal elastically contacts the other terminal of the first terminal and the third terminal.

15. The display apparatus of claim 1, wherein the side surface display panel includes a screen part having a curved surface.

* * * * *

UNITED STATES PATENT AND TRADEMARK OFFICE
CERTIFICATE OF CORRECTION

PATENT NO. : 12,048,106 B2
APPLICATION NO. : 17/745201
DATED : July 23, 2024
INVENTOR(S) : Yonggu Do et al.

It is certified that error appears in the above-identified patent and that said Letters Patent is hereby corrected as shown below:

In the Claims

Column 19, Line 47:
In Claim 3, delete "appliance" and insert --apparatus--

Column 19, Line 60:
In Claim 5, delete "appliance" and insert --apparatus--

Column 19, Line 66:
In Claim 6, delete "appliance" and insert --apparatus--

Column 20, Line 5:
In Claim 7, delete "appliance" and insert --apparatus--

Column 20, Line 19:
In Claim 8, delete "appliance" and insert --apparatus--

Column 20, Line 26:
In Claim 9, delete "appliance" and insert --apparatus--

Column 20, Line 34:
In Claim 10, delete "appliance" and insert --apparatus--

Column 20, Line 43:
In Claim 11, delete "appliance" and insert --apparatus--

Signed and Sealed this
Twenty-second Day of October, 2024

*Katherine Kelly Vidal*

Katherine Kelly Vidal
*Director of the United States Patent and Trademark Office*